US007018895B2

(12) United States Patent  
Ding

(10) Patent No.: US 7,018,895 B2
(45) Date of Patent: Mar. 28, 2006

(54) NONVOLATILE MEMORY CELL WITH MULTIPLE FLOATING GATES FORMED AFTER THE SELECT GATE

(75) Inventor: Yi Ding, Sunnyvale, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 0 days.

(21) Appl. No.: 11/102,066

(22) Filed: Apr. 8, 2005

(65) Prior Publication Data

US 2005/0174851 A1    Aug. 11, 2005

Related U.S. Application Data

(62) Division of application No. 10/631,941, filed on Jul. 30, 2003.

(51) Int. Cl.
*H01L 21/336* (2006.01)
(52) U.S. Cl. .................. 438/257; 438/266; 438/267
(58) Field of Classification Search ............. 438/266, 438/267, 257, 211, 201
See application file for complete search history.

(56) References Cited

U.S. PATENT DOCUMENTS

| | | | |
|---|---|---|---|
| 4,701,776 | A | 10/1987 | Perlegos et al. |
| 5,402,371 | A | 3/1995 | Ono |
| 5,408,115 | A | 4/1995 | Chang |
| 5,424,979 | A | 6/1995 | Morii |
| 5,445,983 | A | 8/1995 | Hong |
| 5,633,185 | A | 5/1997 | Yiu et al. |
| 5,668,757 | A | 9/1997 | Jeng |
| 5,705,415 | A | 1/1998 | Orlowski et al. |
| 5,821,143 | A | 10/1998 | Kim et al. |
| 5,856,943 | A | 1/1999 | Jeng |
| 5,901,084 | A | 5/1999 | Ohnakado |

(Continued)

OTHER PUBLICATIONS

Shirota, Riichiro "A Review of 256Mbit NAND Flash Memories and NAND Flash Future Trend," Feb. 2000, Nonvolatile Memory Workshop in Monterey, California, pp. 22-31.

(Continued)

*Primary Examiner*—Walter L. Lindsay, Jr.
(74) *Attorney, Agent, or Firm*—Michael Shenker; MacPherson Kwok Chen & Heid LLP

(57) ABSTRACT

In a memory cell (110) having multiple floating gates (160), the select gate (140) is formed before the floating gates. In some embodiments, the memory cell also has control gates (170) formed after the select gate. Substrate isolation regions (220) are formed in a semiconductor substrate (120). The substrate isolation regions protrude above the substrate. Then select gate lines (140) are formed. Then a floating gate layer (160) is deposited. The floating gate layer is etched until the substrate isolation regions are exposed. A dielectric (164) is formed over the floating gate layer, and a control gate layer (170) is deposited. The control gate layer protrudes upward over each select gate line. These the control gates and the floating gates are defined independently of photolithographic alignment. In another aspect, a nonvolatile memory cell has at least two conductive floating gates (160). A dielectric layer (164) overlying the floating gate has a continuous feature that overlies the floating gate and also overlays a sidewall of the select gate (140). Each control gate (160) overlies the continuous feature of the dielectric layer and also overlies the floating gate. In another aspect, substrate isolation regions (220) are formed in a semiconductor substrate. Select gate lines cross over the substrate isolation regions. Each select gate line has a planar top surface, but its bottom surface goes up and down over the substrate isolation regions. Other features are also provided.

29 Claims, 21 Drawing Sheets (X1-X1')

(X1-X1')

U.S. PATENT DOCUMENTS

| | | | |
|---|---|---|---|
| 5,910,912 | A | 6/1999 | Hsu et al. |
| 5,912,843 | A | 6/1999 | Jeng |
| 5,918,124 | A | 6/1999 | Sung |
| 6,011,725 | A | 1/2000 | Eitan |
| 6,040,216 | A | 3/2000 | Sung |
| 6,057,575 | A | 5/2000 | Jenq |
| 6,107,141 | A | 8/2000 | Hsu et al. |
| 6,130,129 | A | 10/2000 | Chen |
| 6,133,098 | A | 10/2000 | Ogura et al. |
| 6,134,144 | A | 10/2000 | Lin et al. |
| 6,162,682 | A | 12/2000 | Kleine |
| 6,171,909 | B1 | 1/2001 | Ding et al. |
| 6,187,636 | B1 | 2/2001 | Jeong |
| 6,200,856 | B1 | 3/2001 | Chen |
| 6,214,669 | B1 | 4/2001 | Hisamune |
| 6,218,689 | B1 | 4/2001 | Chang et al. |
| 6,228,695 | B1 | 5/2001 | Hsieh et al. |
| 6,232,185 | B1 | 5/2001 | Wang |
| 6,261,903 | B1 | 7/2001 | Chang et al. |
| 6,265,739 | B1 | 7/2001 | Yaegashi et al. |
| 6,266,278 | B1 | 7/2001 | Harari et al. |
| 6,291,297 | B1 | 9/2001 | Chen |
| 6,326,661 | B1 | 12/2001 | Dormans et al. |
| 6,344,993 | B1 | 2/2002 | Harari et al. |
| 6,355,524 | B1 | 3/2002 | Tuan et al. |
| 6,365,457 | B1 | 4/2002 | Choi |
| 6,388,293 | B1 | 5/2002 | Ogura et al. |
| 6,414,872 | B1 | 7/2002 | Bergemont et al. |
| 6,420,231 | B1 | 7/2002 | Harari et al. |
| 6,436,764 | B1 | 8/2002 | Hsieh |
| 6,437,360 | B1 | 8/2002 | Cho et al. |
| 6,438,036 | B1 | 8/2002 | Seki et al. |
| 6,468,865 | B1 | 10/2002 | Yang et al. |
| 6,486,023 | B1 | 11/2002 | Nagata |
| 6,518,618 | B1 | 2/2003 | Fazio et al. |
| 6,541,324 | B1 | 4/2003 | Wang |
| 6,541,829 | B1 | 4/2003 | Nishinohara et al. |
| 6,566,196 | B1 | 5/2003 | Haselden et al. |
| 6,635,533 | B1 | 10/2003 | Chang et al. |
| 6,642,103 | B1 | 11/2003 | Wils et al. |
| 6,660,589 | B1 | 12/2003 | Park |
| 6,696,340 | B1 | 2/2004 | Furuhata |
| 6,747,310 | B1 | 6/2004 | Fan et al. |
| 6,764,905 | B1 | 7/2004 | Jeng et al. |
| 6,803,276 | B1 | 10/2004 | Kim et al. |
| 6,855,598 | B1 * | 2/2005 | Hung et al. ............ 438/257 |
| 2002/0064071 | A1 | 5/2002 | Takahashi et al. |
| 2002/0197888 | A1 | 12/2002 | Huang et al. |
| 2003/0205776 | A1 | 11/2003 | Yaegashi et al. |

OTHER PUBLICATIONS

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

Wu, A.T.; Chan T.Y.; Ko, P.K.; and Hu, C. "A Novel High-Speed, 5-Volt Programming EPROM Structure With Source-Side Injection," 1986 IEEE, pp. 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18µm Modular Triple Self-Aligned Embedded Split-Gate Flash Memory," 2000 Symposium on VLSI Technology Digest of Technical Papers, pp. 120-121.

Ma, Yale et al., "A Dual-Bit Split-Gate EEPROM (DSG) Cell in Contactless Array for Single Vcc-High Density Flash Memories," 1994 IEEE, 3.5.1-3.5.4.

Spinelli, Alessandro S., "Quantum-Mechanical 2D Simulation of Surface-and Buried-Channel p-MOS,"2000 International Conference on Simulation of Semiconductor Processes and Devices: SISPAD 2000, Seattle, WA Sep. 6-8, 2000.

Kim, K.S. et al. "A Novel Dual String NOR (DuSnor) Memory Cell Technolgy Scalable to the 256 Mbit and 1 Gbit Flash Memories," 1995 IEEE 11.1.1-11.1.4.

Bergemont, A. et al."NOR Virtual Ground (NVG)- A New Scaling Concept for Very High Density FLAS EEPROM and its Implementation in a 0.5 µm Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protruding Portions," filed May 16, 2003.

U.S. Appl. No. 10/440,005, entitled "Fabrication of Dielectric On A Gate Surface To Insulate The Gate From Another Element Of An Integrated Circuit," filed May 16, 2003.

U.S. Appl. No. 10/440,508, entitled "Fabrication Of Gate Dielectric In Nonvolatile Memories Having Select, Floating And Control Gates," filed May 16, 2003.

U.S. Appl. No. 10/440,500, entitled "Integrated Circuits With Openings that Allow Electrical Contact To Conductive Features Having Self-Aligned Edges," filed May 16, 2003.

U.S. Appl. No. 10/393,212, entitled "Nonvolatile Memories And Methods Of Fabrication," filed Mar. 19, 2003.

U.S. Appl. No. 10/411,813, entitled "Nonvolatile Memories With A Floating Gate Having An Upward Protrusion," filed Apr. 10, 2003.

U.S. Appl. No. 10/393,202, entitled "Fabrication of Integrated Circuit Elements In Structures With Protruding Features," filed Mar. 19, 2003.

U.S. Appl. No. 10/631,941, entitled "Nonvolatile Memory Cell With Multiple Floating Gates Formed After The Select Gate," filed on Jul. 30,2003.

U.S. Appl. No. 10/632,155, entitled "Nonvolatile Memory Cells With Buried Channel Transistors," filed Jul. 30, 2003.

U.S. Appl. No. 10/632,007, entitled "Arrays Of Nonvolatile Memory Cells Wherin Each Cell Has Two Conductive Floating Gates," filed Jul. 30, 2003.

U.S. Appl. No. 10/631,452, entitled "Fabrication Of Dielectric For A Nonvolatile Memory Cell Having Multiple Floating Gates," filed Jul. 30, 2003.

U.S. Appl. No. 10/632,154, entitled "Fabrication Of Gate Dielectric In Nonvolatile Memories In Which A Memory Cell Has Multiple Floating Gates," filed Jul. 30, 2003.

U.S. Appl. No. 10/632,186, entitled "Nonvolatile Memory Cell With Multiple Floating Gates Formed After The Select Gate And Having Upward Protrusions," filed Jul. 30, 2003.

U.S. Appl. No. 60/631,552, entitled "Nonvolatile Memories And Methods Of Fabrication," filed Jul. 30, 2003.

* cited by examiner

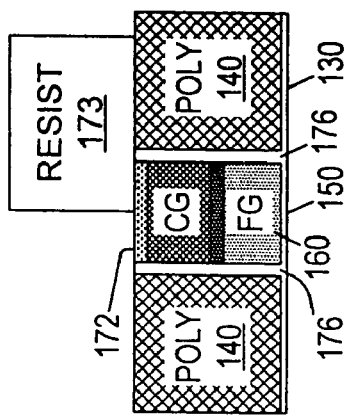
FIG. 3 PRIOR ART
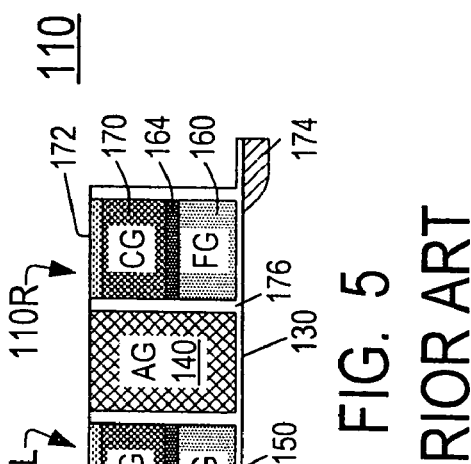
FIG. 2 PRIOR ART
FIG. 5 PRIOR ART
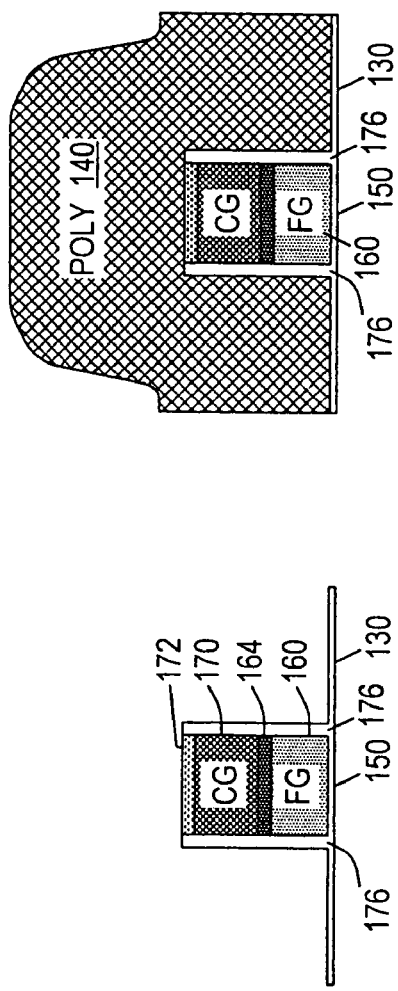
FIG. 1 PRIOR ART
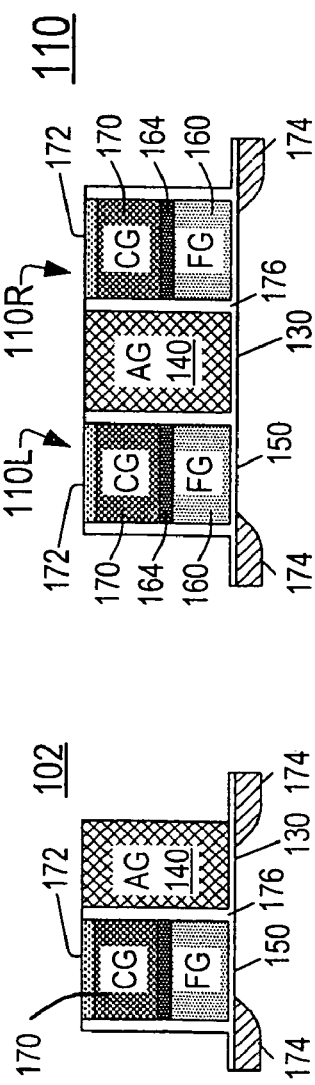
FIG. 4 PRIOR ART

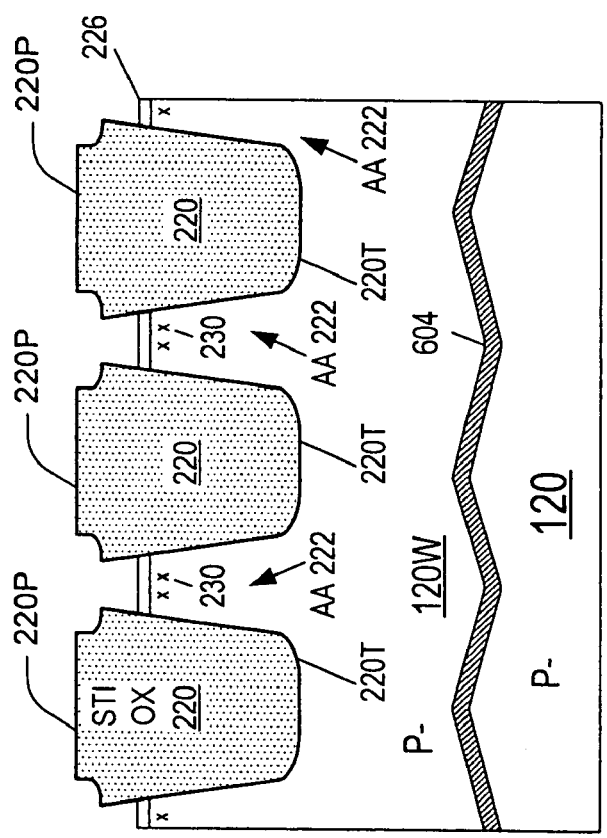
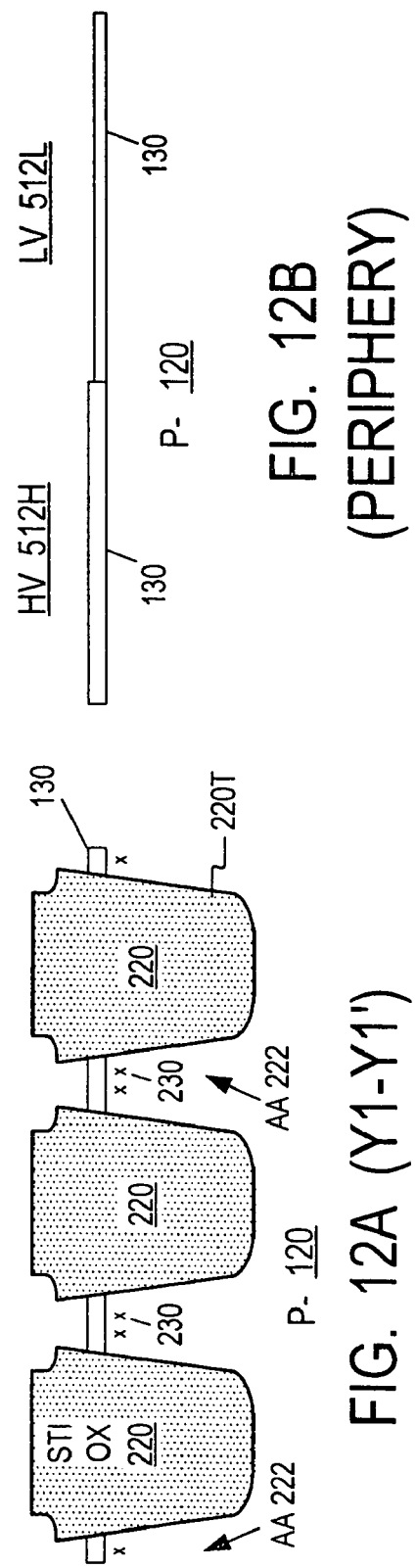

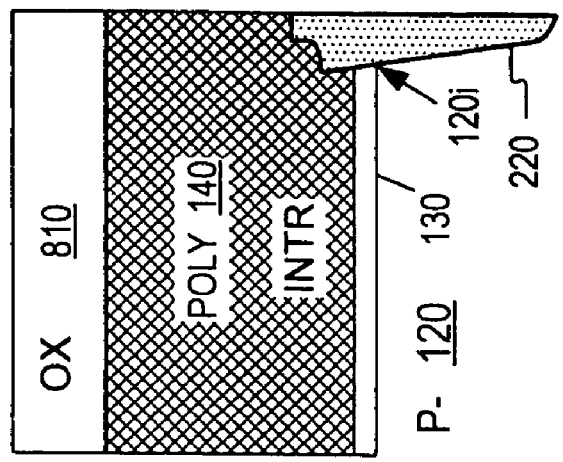
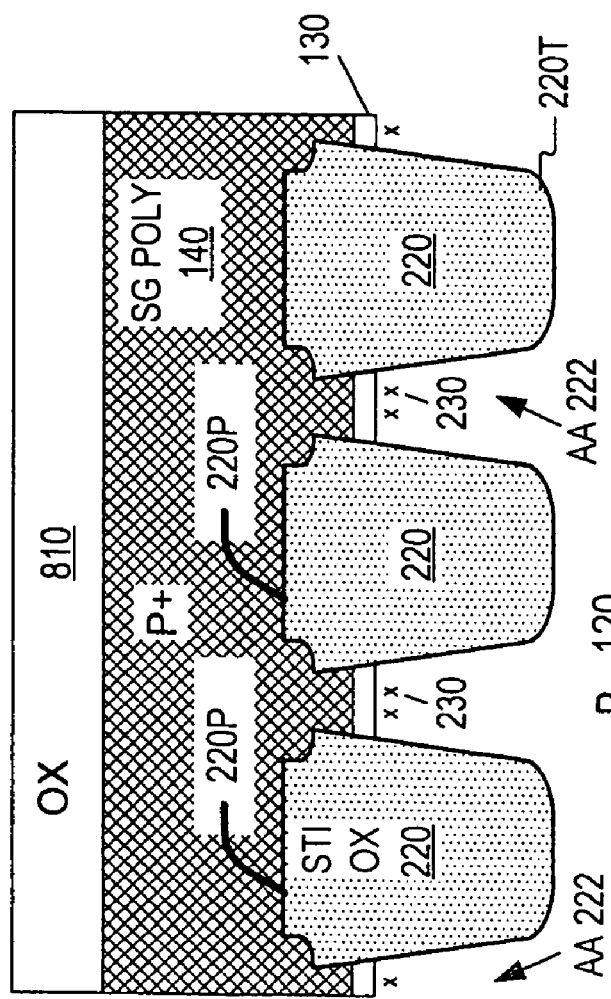

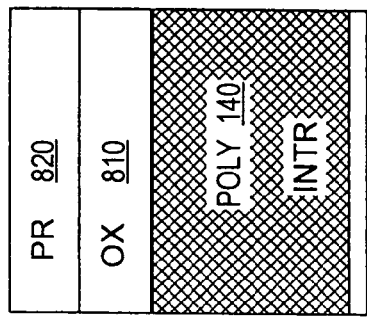
FIG. 14B (PERIPHERY)
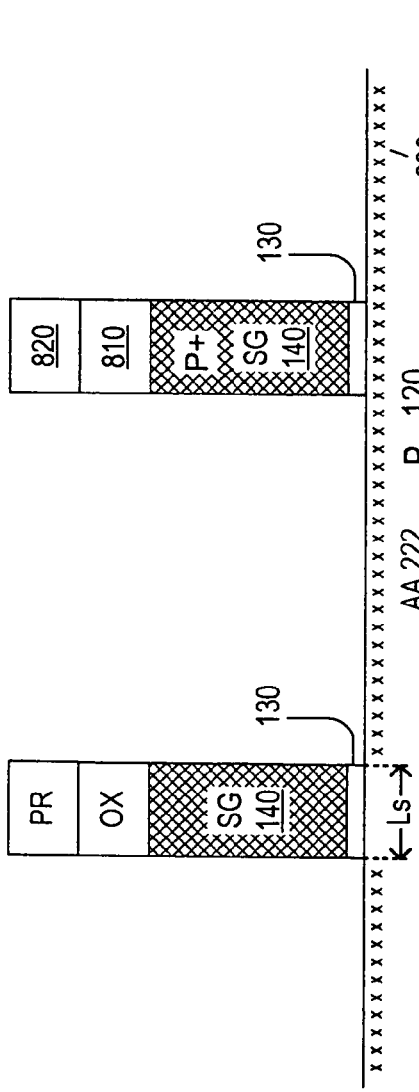
FIG. 14A (X1-X1')
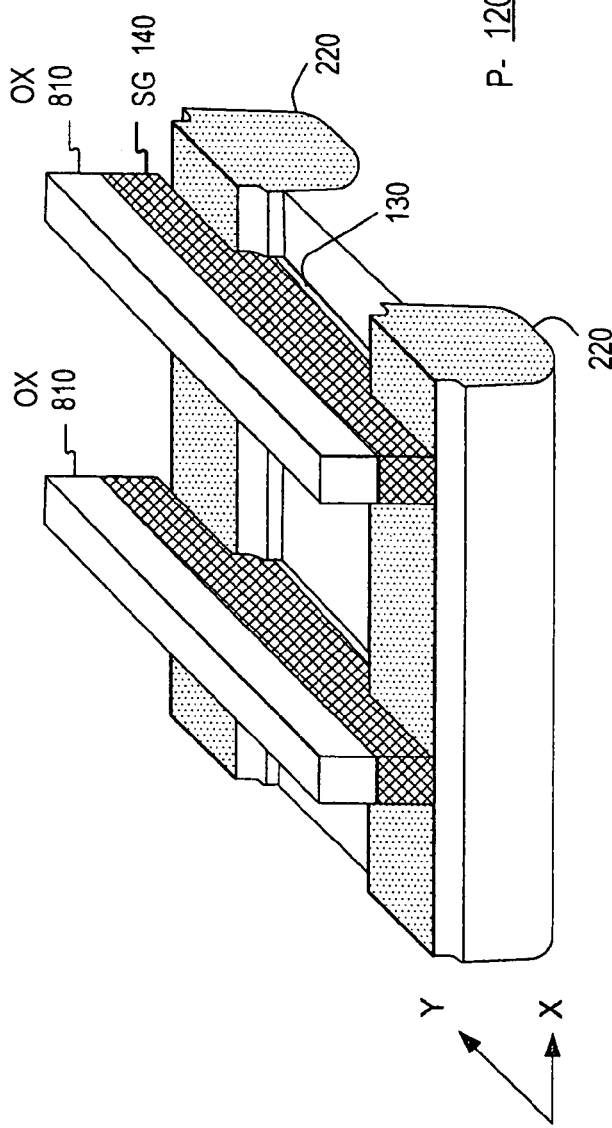
FIG. 15

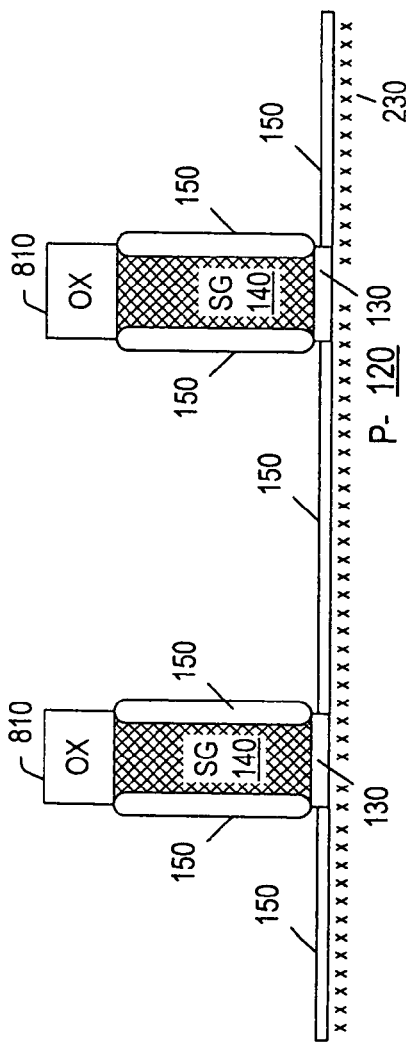
FIG. 16 (X1-X1')
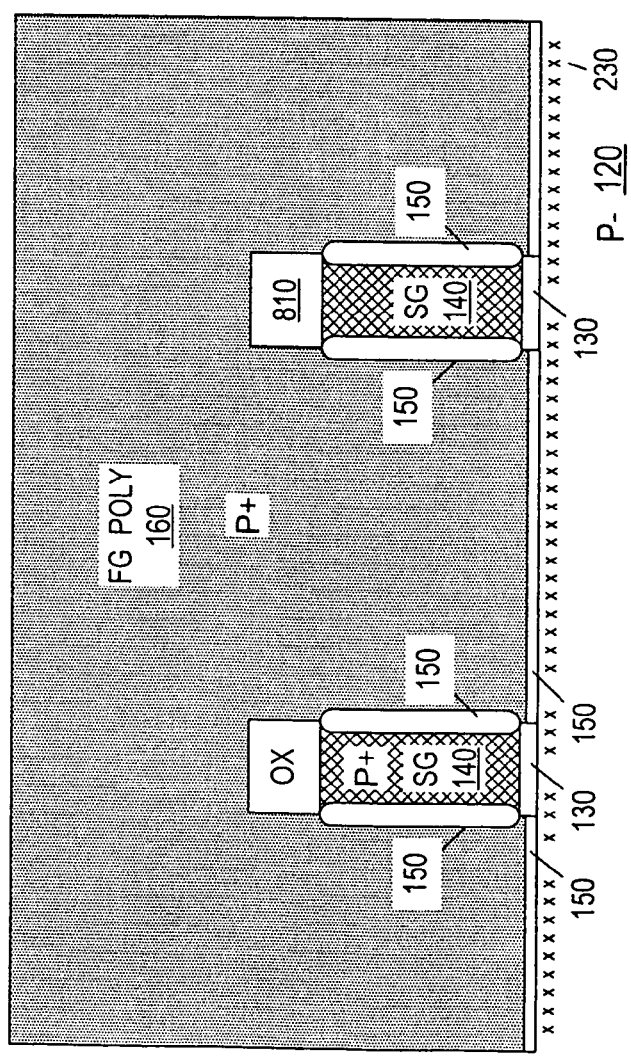
FIG. 17 (X1-X1')

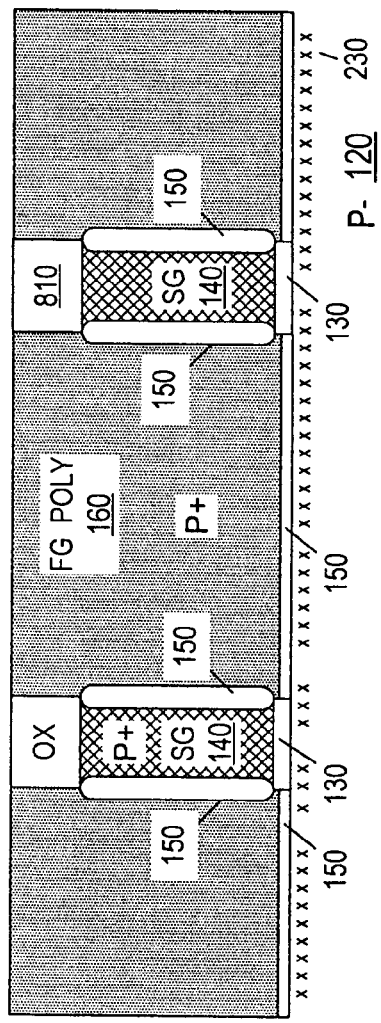
FIG. 18 (X1-X1')
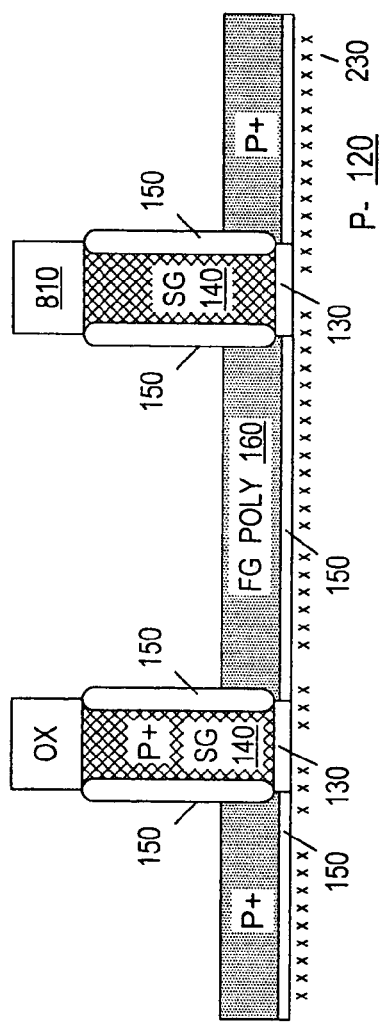
FIG. 19A (X1-X1')
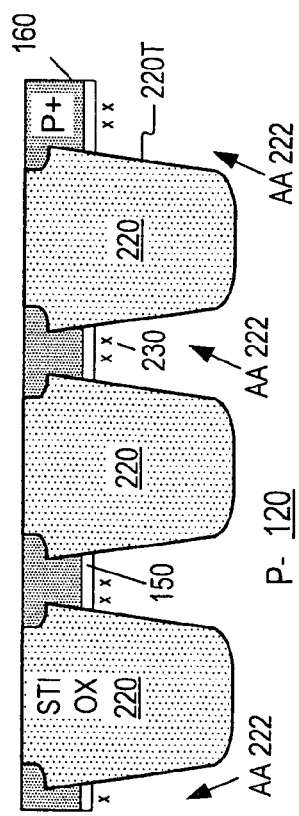
FIG. 19B (Y2-Y2')

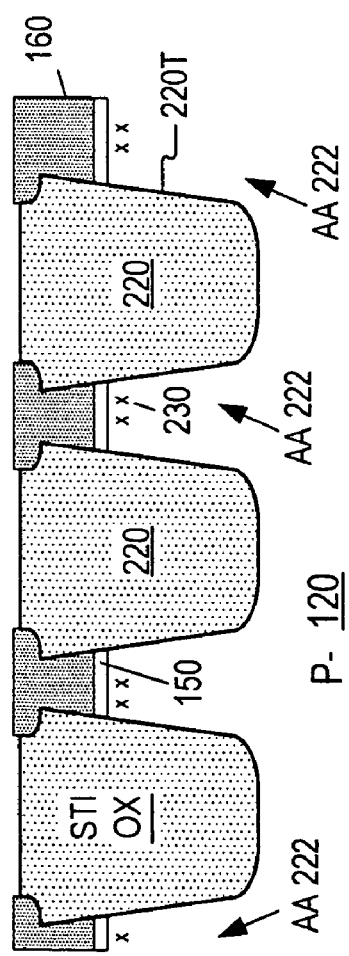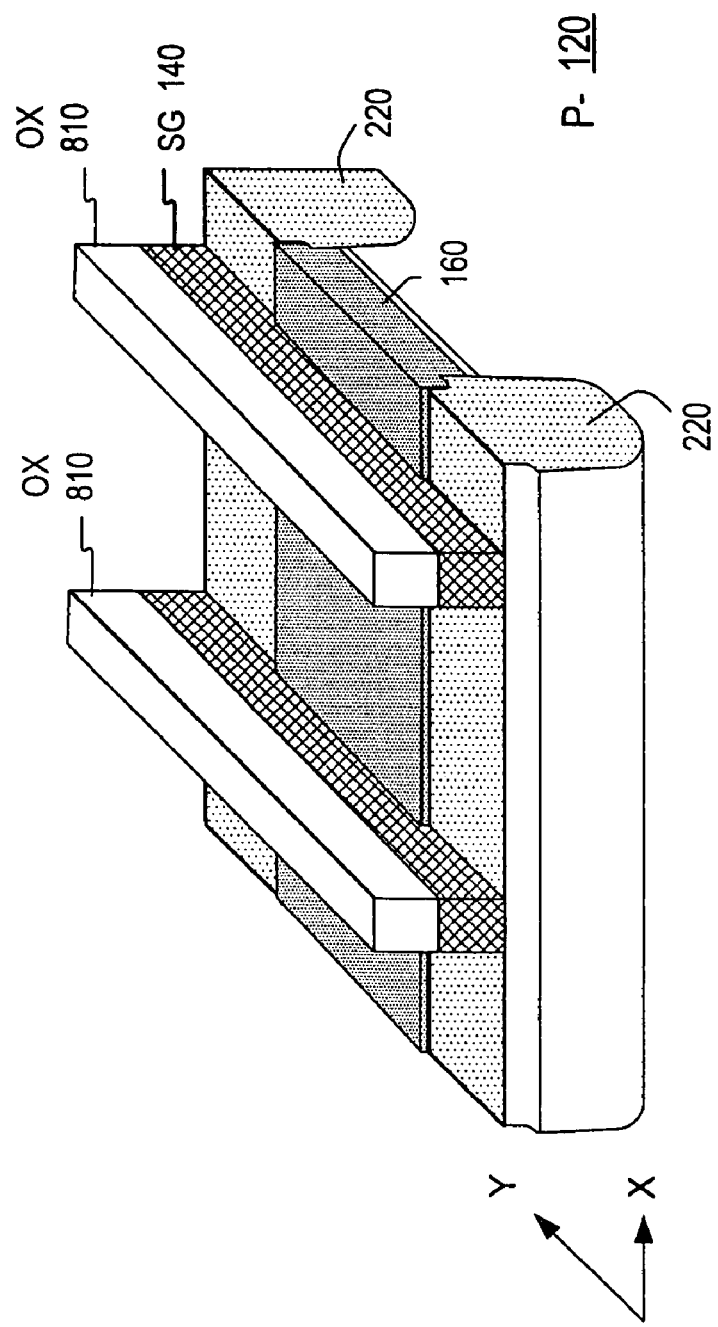

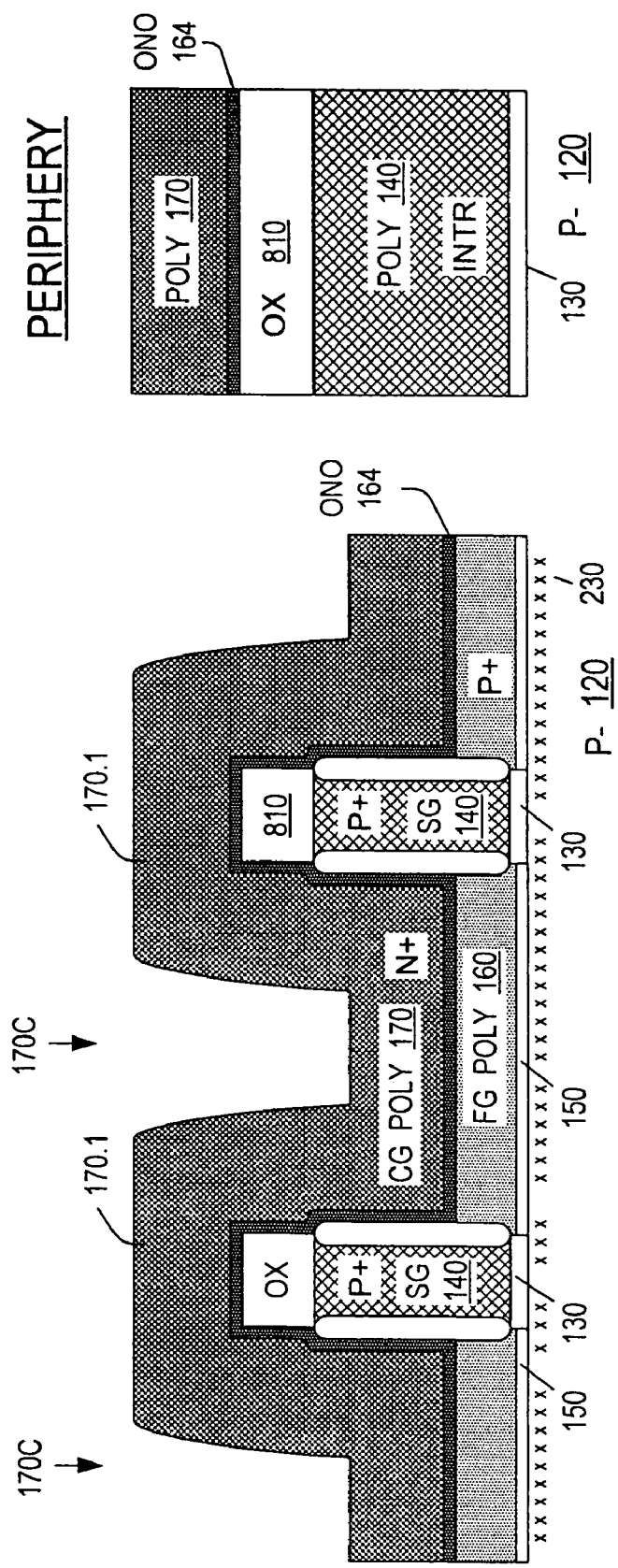

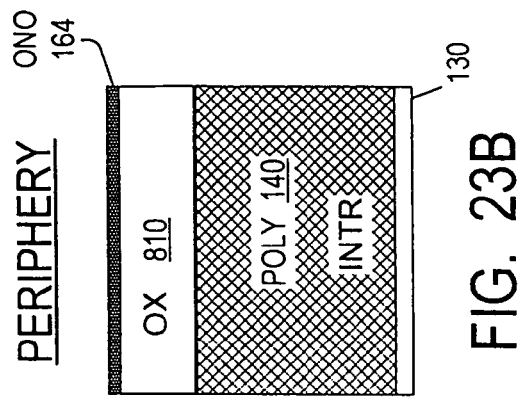
FIG. 23B
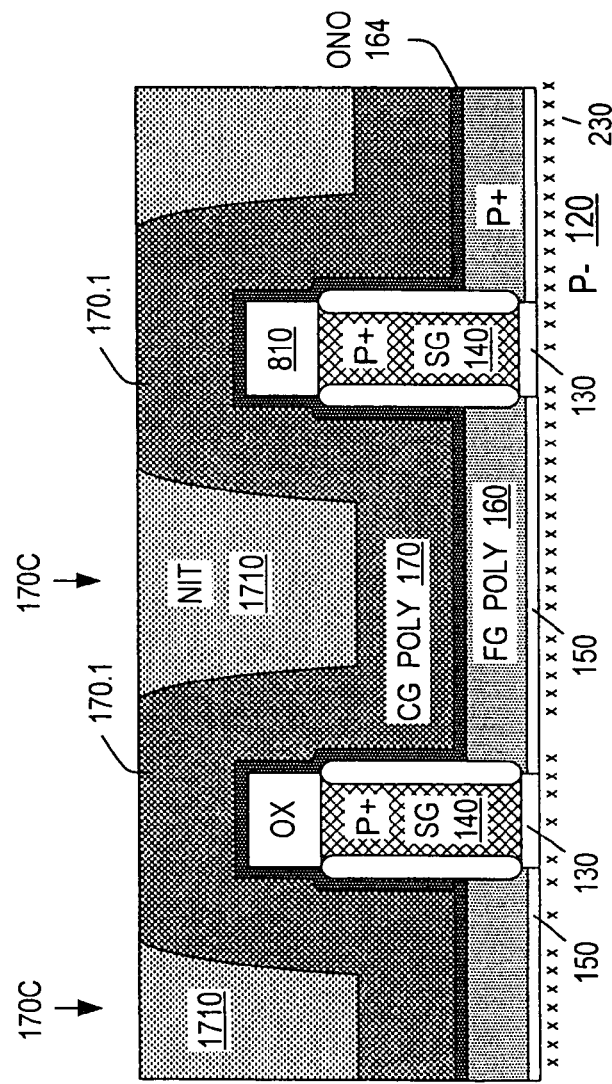
FIG. 22 (X1-X1')
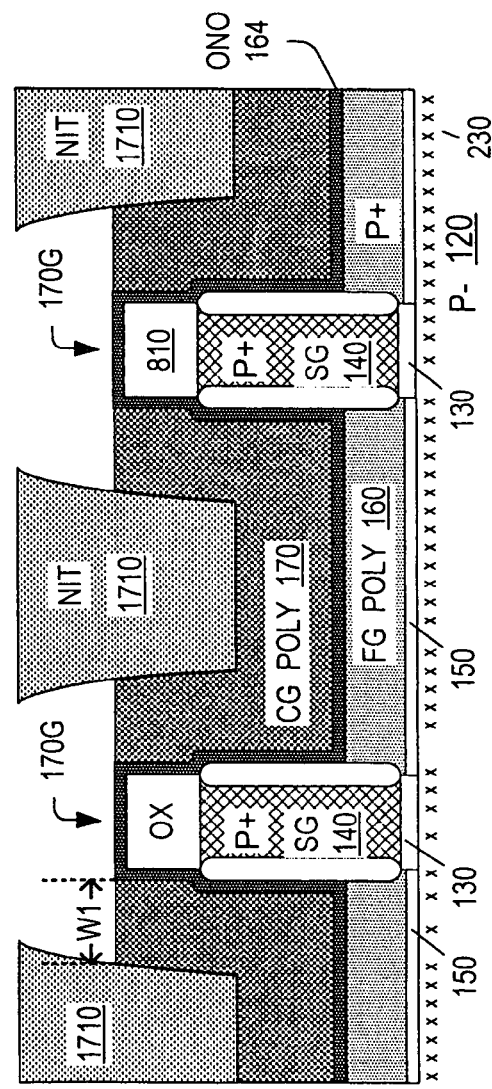
FIG. 23A (X1-X1')

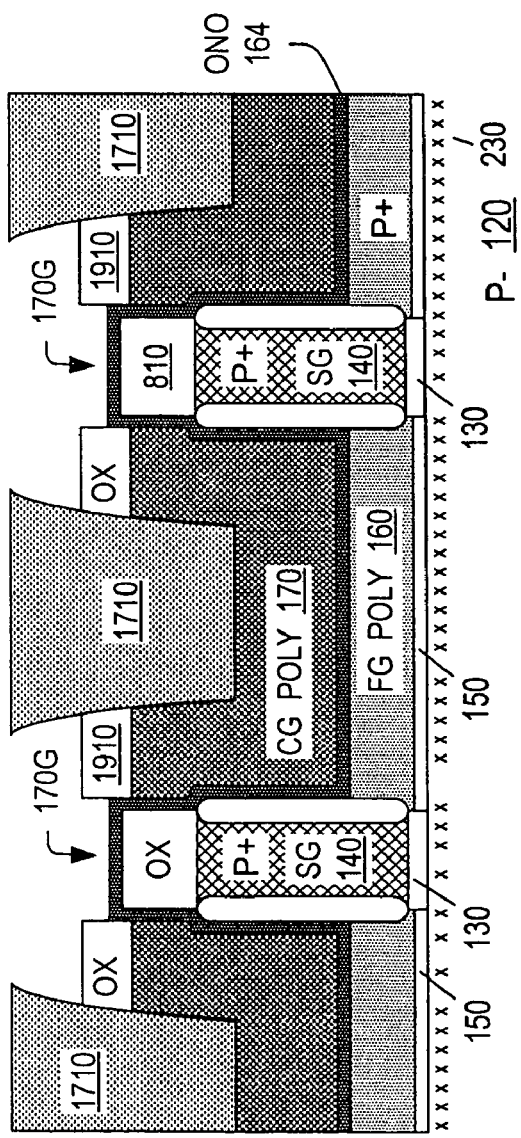
FIG. 24 (X1-X1')
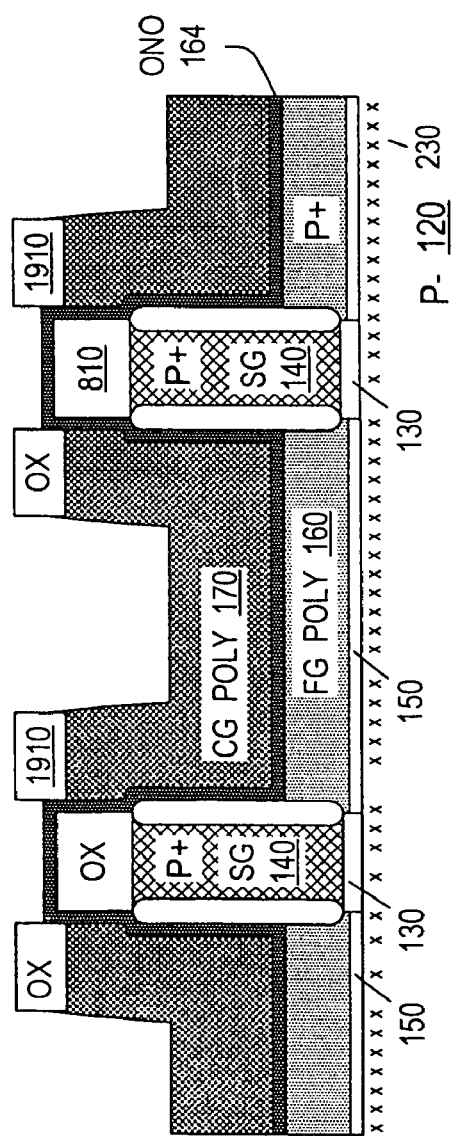
FIG. 25 (X1-X1')

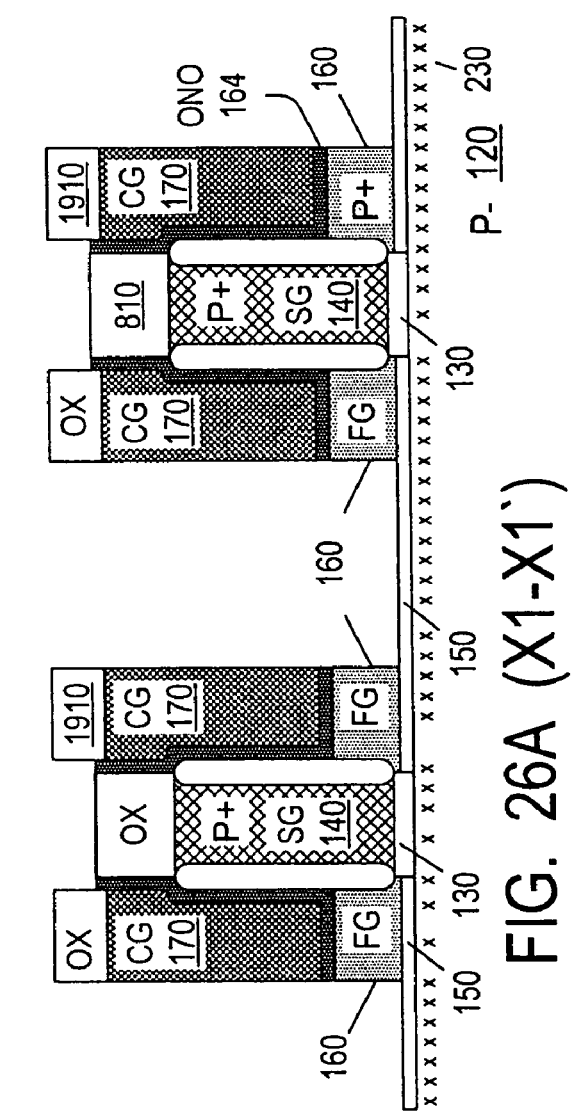
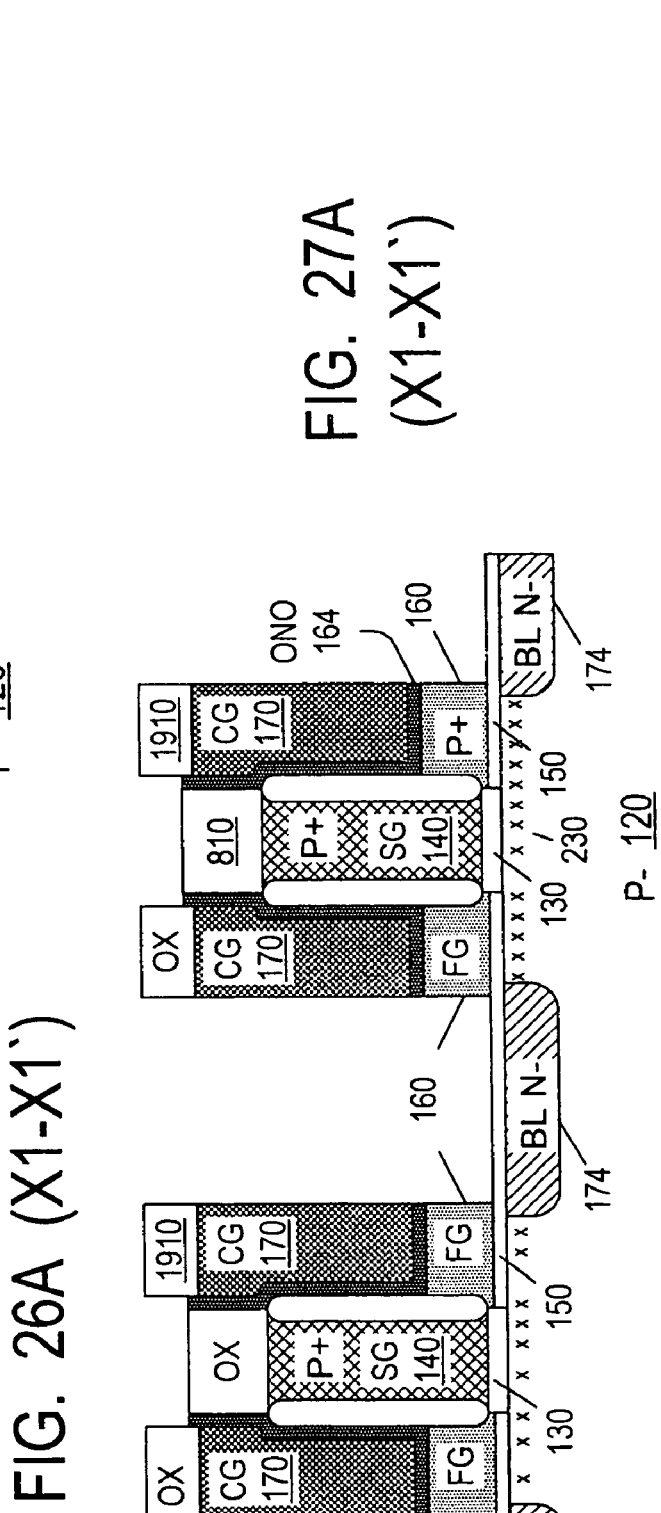

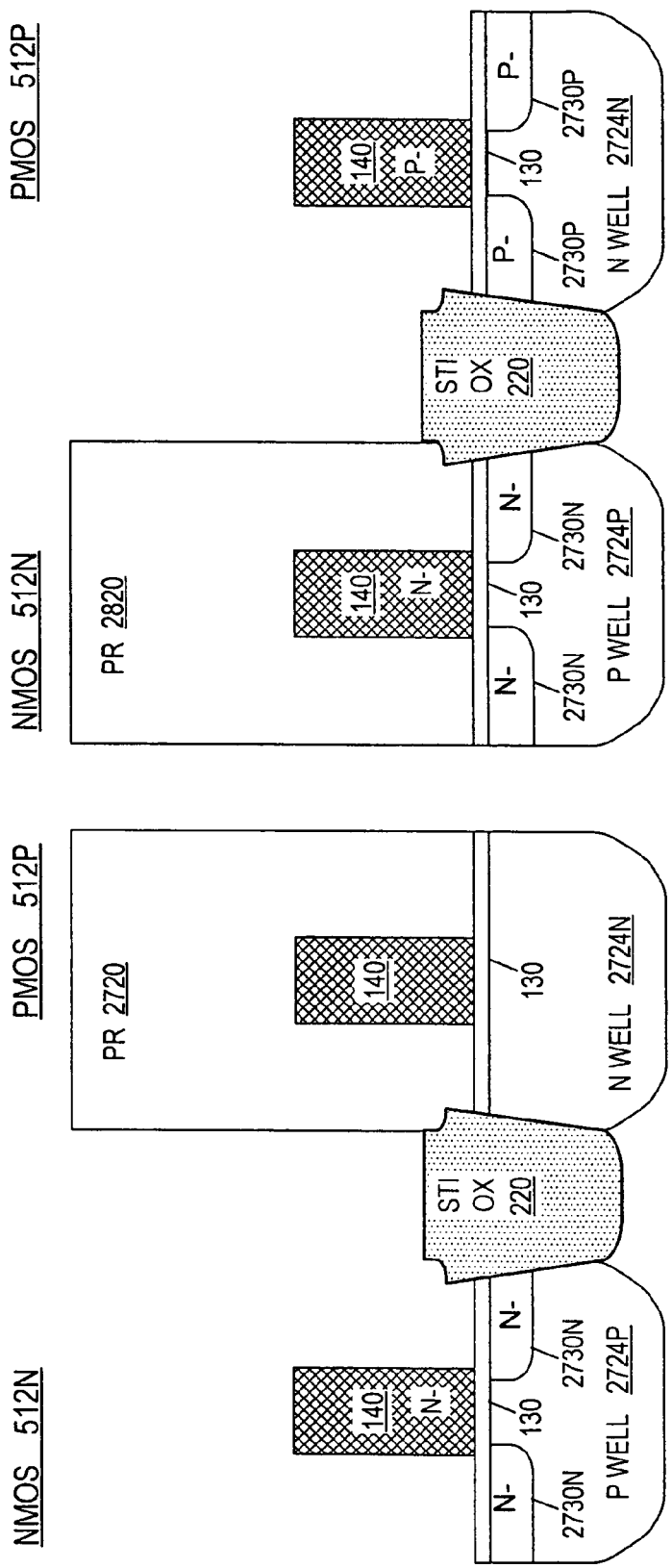
FIG. 28 (PERIPHERY)
FIG. 27B (PERIPHERY)

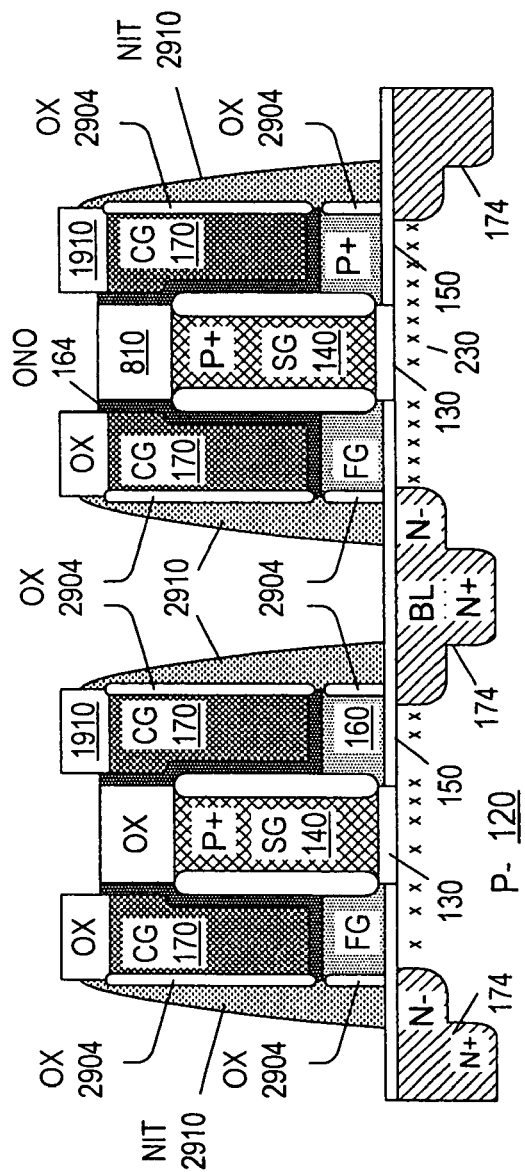
FIG. 29A (X1-X1')
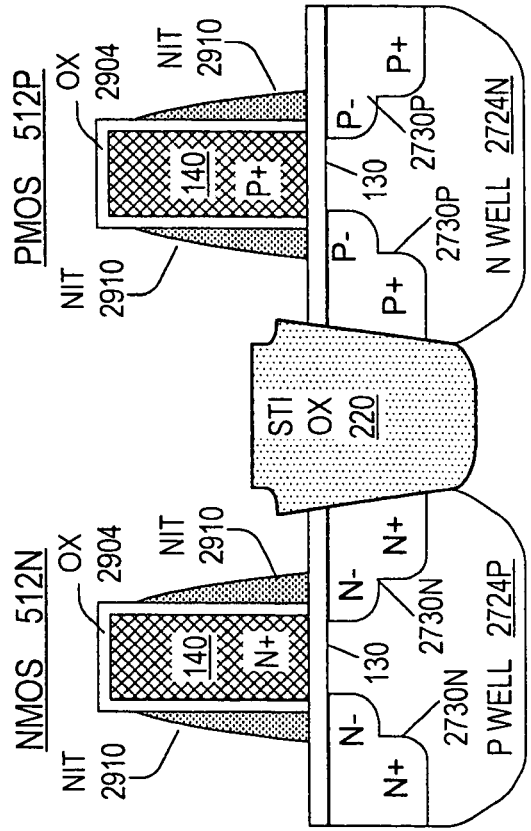
FIG. 29B (PERIPHERY)

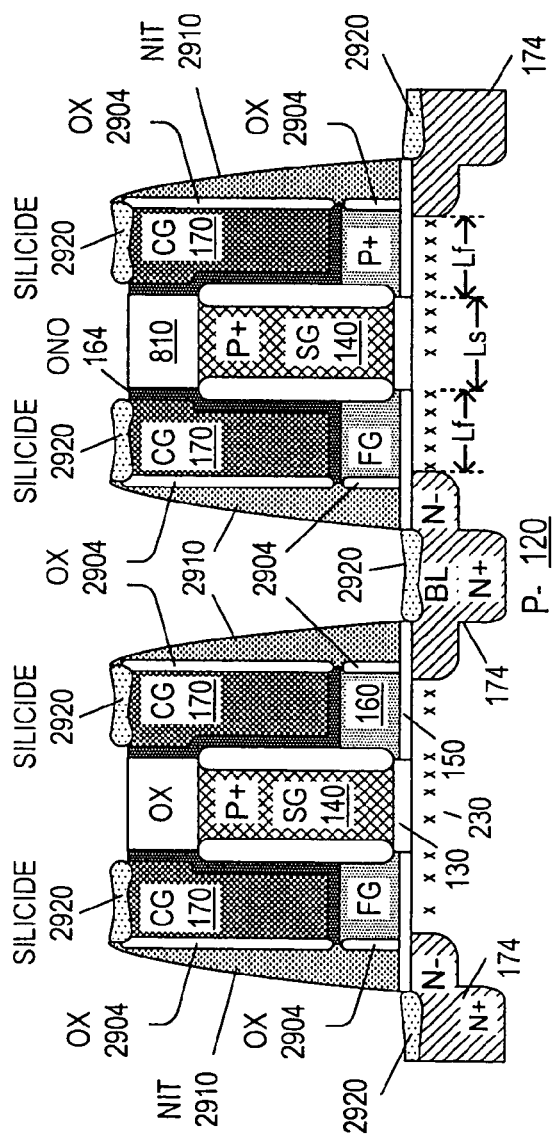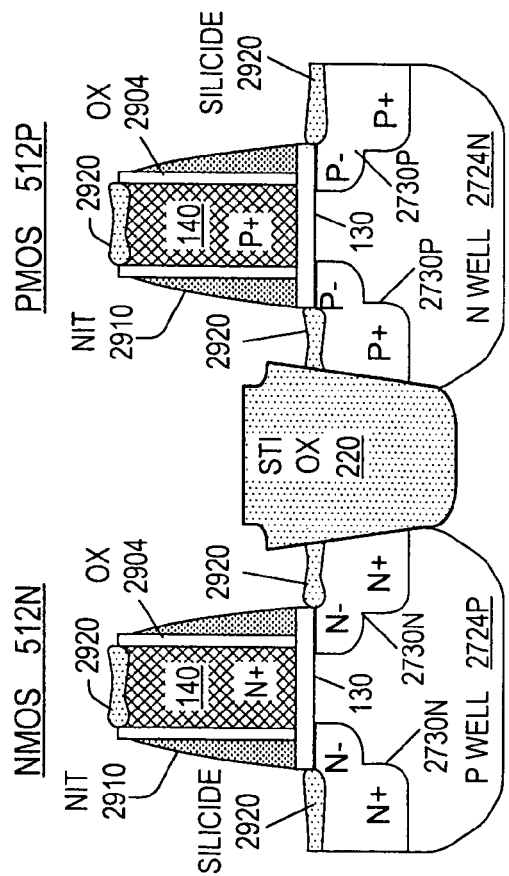
FIG. 30A (X1-X1')
FIG. 30B (PERIPHERY)

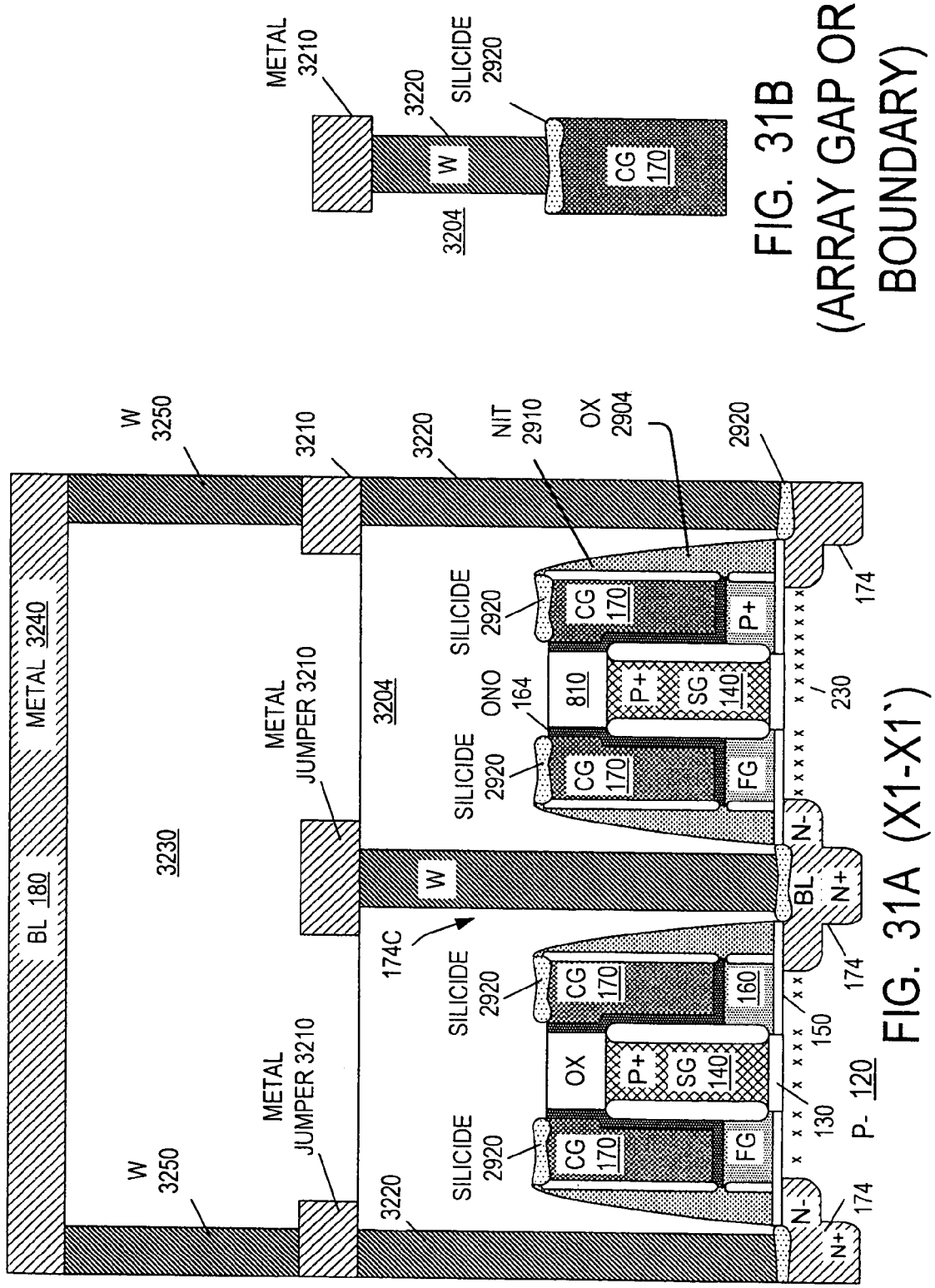

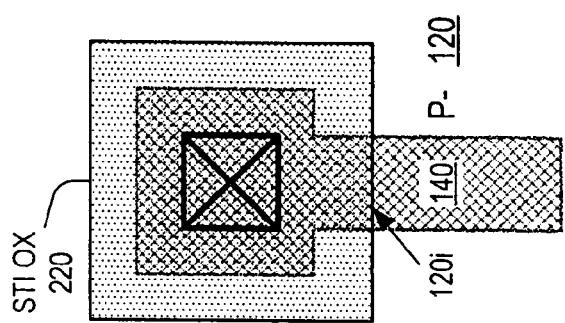
FIG. 31E (PERIPHERY)
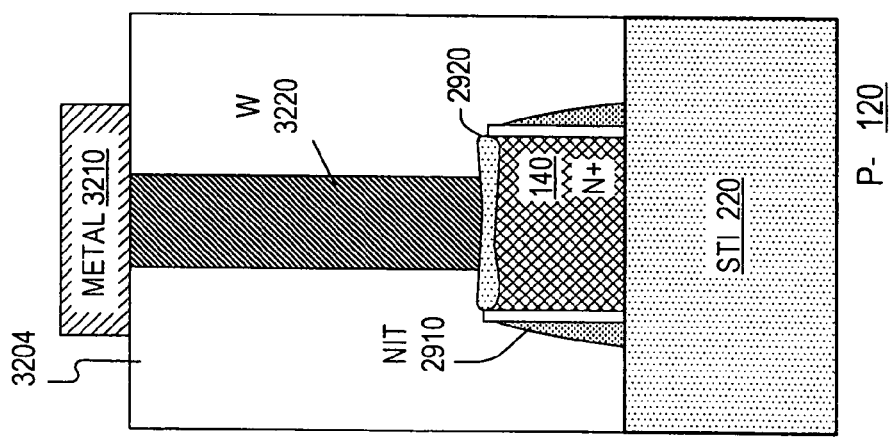
FIG. 31D (PERIPHERY)
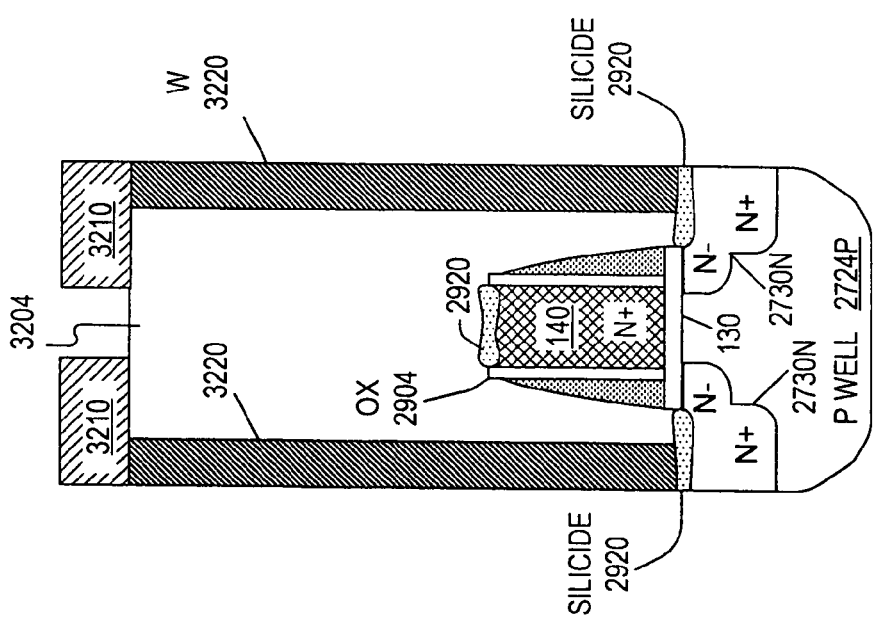
FIG. 31C (PERIPHERY)

NONVOLATILE MEMORY CELL WITH MULTIPLE FLOATING GATES FORMED AFTER THE SELECT GATE

CROSS REFERENCE TO RELATED APPLICATIONS

The present application is a division of U.S. patent application Ser. No. 10/631,941 filed on Jul. 30, 2003, incorporated herein by reference.

BACKGROUND OF THE INVENTION

The present invention relates to nonvolatile memories.

FIGS. 1–4 illustrate a flash memory fabrication process described in van Duuren et al., "Compact poly-CMP embedded flash memory cells for one or two bit storage", Proceedings of NVSMW 2003 (Non-Volatile Semiconductor Memory Workshop), Monterey, Calif., pages 73–74. Tunnel oxide 150, polysilicon floating gate 160, inter-poly dielectric 164, control gate 170, and a nitride cap layer 172 are fabricated in a stacked structure ("FG/CG stack"). TEOS spacers 176 are formed on both sides of the stack. Then oxide 130 is grown for the access gate.

AG (access gate) polysilicon 140 is deposited over the FG/CG stack. See FIG. 2. Polysilicon 140 is polished by chemical mechanical polishing (CMP), as shown in FIG. 3. Then polysilicon 140 is patterned using resist 173 to define the access gate, as shown in FIGS. 3 and 4. Source/drain regions 174 are formed to obtain a one-bit memory cell 102 (FIG. 4).

As noted in the Duuren et al. article, the length of access gate 140 depends on the mask alignment, "which could lead to an odd-even word line effect in arrays".

FIG. 5 shows a two-bit memory cell 110 described in the same article. Two FG/CG stack transistors 110L, 110R share an access gate 140. According to the Duuren et al. article, the cell is fabricated with the same process as cell 102, but cell 110 is fully self-aligned and therefore not sensitive to mask misalignment.

Each bit 110L, 110R can be programmed or erased independently of the other bit. The bit can be programmed by Fowler-Nordheim tunneling (FN) or source side injection (SSI). The Duuren et al. article states that the two bit cell has been studied "with 180 bit arrays in a virtual ground configuration". The read, program (SSI) and erase voltages bit 110R are shown respectively in FIGS. 6, 7 and 8. In the read and program operations (FIGS. 6 and 7), the "pass" voltage for the control gate in bit 110L (6.0 V) is high enough to turn on the corresponding FG/CG transistor regardless of the state of its floating gate.

Alternative fabrication methods for the two bit cells are desirable.

SUMMARY

This section summarizes some features of the invention. Other features are described in the subsequent sections. The invention is defined by the appended claims which are incorporated into this section by reference.

The present invention relates to fabrication of a memory cell having multiple floating gates (such as the cell of FIG. 5, for example). In some embodiments, the access gate is formed before the floating gates. In some embodiments, the memory cell also has control gates (like in FIG. 5), and the access gate is formed before the floating and control gates.

Below the term "select gate" is used instead of "access gate".

In some embodiments, forming the select gate before the floating gate makes it possible to reduce the select gate width below the minimal photolithographic line width. For example, the select gate, or a mask used to pattern the select gate, can be subjected to a horizontal etch (e.g. isotropic etch) to reduce the select gate width. Alternatively, the select gate sidewalls can be oxidized and then the oxide can be removed to reduce the gate length.

In some embodiments, the memory cell includes an FG/CG stack (such as in FIG. 5), but this stack is formed after the select gate and after the dielectric that separates the stack from the select gate (note dielectric 176 in FIG. 5). The stack is formed by a deposition of the FG and CG layers followed by an etch. The etch does not attack the edges of the FG and CG layers adjacent to the dielectric near the select gate. Therefore, the vertical edge of the FG/CG stack near the select gate is not defined by this etch. This is advantageous because when a vertical edge is defined by the etch of the FG/CG stack, the edge may be non-uniform, with the different edges having different profiles. Also, the edge defined by the stack etch may have protruding "shoulders" which impede formation of subsequent layers. The present invention allows the etch requirements to be relaxed.

In some embodiments, the cell is completely self-aligned (the floating, control and select gates do not depend on the mask alignment), but the invention is not limited to such embodiments.

In some embodiments, substrate isolation regions are formed in a semiconductor substrate. Each substrate isolation region is a dielectric region protruding above the substrate. Then the select gates are formed. The select gates are part of select gate lines. Each select gate line provides select gates for at least one memory row. Then a floating gate layer (e.g. polysilicon) is deposited. The floating gate layer is etched until the substrate isolation regions are exposed. In some embodiments, the exposure of the substrate isolation regions serves as an end point for the floating gate layer etch.

In some embodiments, the memory also has control gates. A control gate layer is deposited over the floating gate layer. The control gate layer protrudes upward over each select gate line. These protrusions are exploited to define the control gates in a self-aligned manner. The floating gates are then also defined in a self-aligned manner.

One embodiment of the present invention is a nonvolatile memory cell comprising a conductive floating gate. A dielectric layer overlying the floating gate has a continuous feature that overlies the floating gate and also overlays a sidewall of the select gate. The control gate overlies the continuous feature of the dielectric layer. The continuous feature of the dielectric layer separates the control gate from the select gate.

Other features and advantages of the invention are described below. The invention is defined by the appended claims.

BRIEF DESCRIPTION OF THE DRAWINGS

FIGS. 1–8 shows vertical cross sections of prior art memory cells and intermediate structures obtained in prior art fabrication processes.

FIGS. 11, 12A, 12B, 13A, 13B, 14A, 14B show vertical cross sections of integrated circuit structures according to embodiments of the present invention.

FIG. 15 is a perspective view of an integrated circuit structure according to an embodiment of the present invention.

FIGS. 16, 17, 18, 19A, 19B, 20A, 20B, 21A, 21B, 22, 23A, 23B, 24, 25, 26A, 26B, 27A, 27B, 28, 29A, 29B, 30A, 30B, 31A–31D show vertical cross sections of integrated circuit structures according to embodiments of the present invention.

FIGS. 31E, 32 are top views of integrated circuit structures according to embodiments of the present invention.

DESCRIPTION OF SOME EMBODIMENTS

Figure 6:
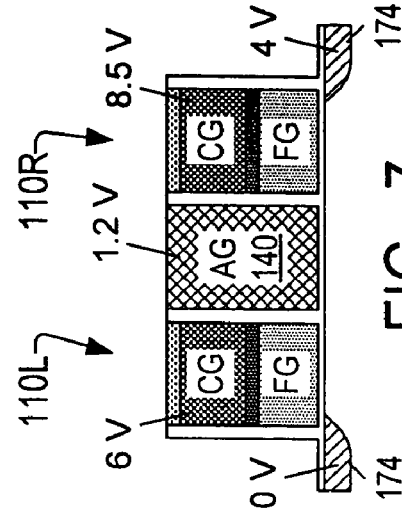

The embodiments described in this section illustrate but do not limit the invention. The invention is not limited to particular materials, process steps, or dimensions. The invention is defined by the appended claims.

One embodiment of the invention will now be described on the example of the memory array of FIG. 9. In this example, the array has 4 rows and 5 columns, but any number of rows and columns can be present. FIG. 10A is a top view of the array. FIG. 10B is a perspective view. Each memory cell 110 may have the same structure is in FIG. 5, but may also have a different structure (see e.g. FIG. 30A). Each cell 110 has two FG/CG stacks per one select gate 140. Conductive select gate lines 140 and conductive control gate lines 170 run through the memory array in the Y direction (row direction). Each row includes one select gate line 140 and two control gate lines 170. The line 140 provides the select gates for that row of cells. One of the lines 170 provides the control gates for the bits 110L in that row, and the other line 170 provides the control gates for the bits 110R. Bitlines 180 (marked BL0–BL5 for rows 0–5) run in the X direction (column direction). The bitlines contact the corresponding source/drain regions 174 ("bitline regions") in areas 174C (FIG. 10A) marked with a cross. Floating gates 160 are marked with dashed crosses in FIG. 10A. The floating gates can be completely self-aligned (i.e. defined independently of photolithographic alignment), as described below.

Substrate isolation trenches 220T run through the array in the X direction. Trenches 220T are filled with dielectric 220 (field isolation). Active areas 222 run through the array between the trenches 220T. Each active area 222 includes active areas of individual cells in one memory column. The active area of each cell consists of the cell's source/drain regions 174 and the P type channel region extending between the regions 174.

In each column, each two consecutive memory cells have their adjacent source/drain regions 174 merged into a single contiguous region (referenced by the same numeral 174). Each such region 174 provides the source/drain regions to only two of the memory cells in each column. In each column 1–4 (each column except the first column and the last column), each source/drain region 174 is connected to a source/drain region 174 of an adjacent column. The connections alternate, e.g. one source/drain region 174 in column 1 is connected to a source/drain region 174 in column 0, the next region 174 in column 1 is connected to region 174 in column 2, the next region 174 in column 1 is connected to region 174 in column 0, and so on. Bitline BL1 (column 1) is connected to those regions 174 of column 1 that are connected to column 0; bitline BL2 is connected to those regions 174 in column 1 that are connected to column 2, and so on. Bitlines BL0 and BL5 are each connected to only one column. In some embodiments, these two bitlines are shorted together.

As shown in FIG. 10A, the source/drain regions 174 of each column are separated from the source/drain regions 174 in the adjacent columns by field isolation regions 220.

Some of the figures below illustrate vertical cross sections of intermediate structures obtained during the memory fabrication. The sectional planes are indicated in FIG. 10A by lines X1–X1', X2–X2', Y1–Y1', and Y2–Y2'. The line X1–X1' runs in the X direction through floating gates 160 (through an active area 222). The line X2–X2' runs in the X direction between the floating gates (through a trench 220T). The line Y1–Y1' runs in the Y direction through a select gate line 140. The line Y2–Y2' runs in the Y direction through a control gate line 170 and floating gates 160.

In one embodiment, the memory is fabricated as follows. Substrate isolation regions 220 are formed in P doped substrate 120 by shallow trench isolation technology ("STI"). See FIG. 11 (cross section Y1–Y1'). Each region 220 is a dielectric region formed in a trench 220T. Suitable STI processes are described in U.S. Pat. No. 6,355,524 issued Mar. 12, 2002 to Tuan et al.; U.S. patent application Ser. No. 10/262,785 filed Oct. 1, 2002 by Yi Ding; and U.S. patent application Ser. No. 10/266,378 filed Oct. 7, 2002 by C. Hsiao, all incorporated herein by reference. Other STI and non-STI processes are also possible. Dielectric 220 is sometimes called "STI oxide" hereinbelow because it is silicon dioxide in some embodiments. The invention is not limited to such embodiments or to silicon integrated circuits.

Substrate isolation regions are also formed in the memory peripheral area (not shown in FIG. 11). The peripheral area contains circuitry needed to access the memory, and may also contain unrelated circuitry (the memory may be embedded into a larger system).

As shown in FIG. 11, oxide 220 protrudes above the substrate 120. The protruding portions are shown at 220P. An exemplary thickness of portions 220P is 0.12 μm for a 0.18 μm fabrication process (a process with a 0.18 μm minimum line width). The exemplary dimensions given in this section assume a 0.18 μm fabrication process unless mentioned otherwise.

Dopant is implanted into substrate 120 to form an N type region 604 underlying the memory array. Dopant is also implanted into the substrate around the array to form a surrounding N type region (not shown) extending from the top surface of substrate 120 down to region 604. These implants create a fully isolated P well 120W for the memory array. Region 604 is not shown in the subsequent drawings, and the P well 120W is shown simply as substrate 120.

Ion implantation steps ("Vt adjust implants") may be performed into the active areas of substrate 120 to adjust the transistor threshold voltages as needed. One such implant is an N type implant (e.g. arsenic) performed into the array to reduce the threshold voltage of the select gate transistors. This implant creates a counterdoped region 230 at the surface of substrate 120. Region 230 may remain type P, but the net P type dopant concentration in this region is reduced. In some embodiments, region 230 becomes N type in this counterdoping step.

Silicon dioxide 130 (FIG. 12A, cross section Y1–Y1', and FIG. 12B, periphery) is thermally grown on the exposed areas of substrate 120 to provide gate dielectric for the select gates of the memory array and for the peripheral transistors. An exemplary thickness of oxide 130 in the array area is 120

Å. Generally, the oxide thickness depends on the maximum voltage that the oxide 130 is designed to sustain during the memory operation. Oxide 130 can be nitrided when it is being grown, or after it has been grown, to impede boron diffusion from floating gates 160 into substrate 120.

In the example shown in FIG. 12B, the peripheral area includes a high voltage transistor area 512H and a low voltage transistor area 512L. Oxide 130 is grown thermally to a thickness of 60 Å over the entire wafer. This oxide is removed from the low voltage area 512L by a masked etch. The wafer is re-oxidized to re-grow silicon dioxide in area 512L to a thickness of 60 Å. The oxide thickness in the memory array area and in high voltage area 512H increases from 60 Å to 120 Å during this step.

Thus, oxide 130 in the array area and oxide 130 in the high voltage peripheral area 512H is formed simultaneously in these two oxidation steps. All of oxide 130 in area 512L and part of the oxide 130 in the array area and area 512H are formed simultaneously in the second oxidation step.

As shown in FIG. 13A (cross section Y1–Y1') and FIG. 13B (periphery), intrinsic polysilicon layer 140 is formed over the structure by a conformal deposition process (e.g. low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

FIG. 13B may represent either the low voltage or the high voltage transistor area. In some embodiments, there are more than two peripheral areas with different gate oxide thicknesses, and FIG. 13B may represent any of these areas.

Polysilicon 140 covers the regions 120i (FIG. 13B) at the interface between substrate 120 and field oxide 220 in the peripheral area. Polysilicon 140 will protect the oxide 220 in this area to prevent formation of grooves ("divots") during subsequent processing. Polysilicon 140 will be used to form the peripheral transistor gates. The grooving in regions 120i under the transistor gates is undesirable because it degrades the transistor characteristics.

Layer 140 can also be formed by non-conformal deposition processes, whether known or to be invented. If the top surface of polysilicon 140 is not planar, it is believed that the polysilicon 140 can be planarized using known techniques (e.g. CMP, or spinning a photoresist layer over the polysilicon 140 and then simultaneously etching the resist and the polysilicon at equal etch rates until all of the photoresist is removed). The bottom surface of polysilicon 140 is nonplanar as it goes up and down over the oxide protrusions 220P.

An exemplary final thickness of polysilicon 140 is 0.16 μm over the active areas.

The peripheral area is masked, and polysilicon 140 is doped P+ in the array area. Polysilicon 140 remains undoped ("INTR", i.e. intrinsic) in the periphery. The peripheral transistor gates will be doped later, with the NMOS gates doped N+ and the PMOS gates P+, to fabricate surface channel transistors in the periphery with appropriate threshold voltages. The invention is not limited to the surface channel transistors or any peripheral processing. In particular, entire polysilicon 140 can be doped N+ or P+ after the deposition or in situ.

Silicon dioxide 810 is deposited on polysilicon 140, by CVD (TEOS) or some other process, to an exemplary thickness of 1500 Å. Layer 810 can also be silicon nitride, silicon oxynitride (SiON), or some other material. Layer 810 is sufficiently thick to withstand subsequent oxide etches (and in particular the etch of STI oxide 220 described below in connection with FIG. 20A) and to protect the select gates 140 from counterdoping during subsequent doping steps.

In some embodiments, the top surface of polysilicon 140 and/or oxide 810 is not planar.

The wafer is coated with a photoresist layer 820. See FIG. 14A, cross section X1–X1', and FIG. 14B, periphery. (FIG. 14B shows only the active area, not the field oxide 220.) Resist 820 is patterned to define the select gate lines 140. The peripheral area is covered by the resist. The memory array geometry is not sensitive to a misalignment between mask 820 and the mask defining the isolation trenches 220T (FIGS. 10A, 10B) except possibly at the boundary of the memory array.

Silicon dioxide 810 is etched through the resist openings. The resist is removed, and polysilicon 140 is etched away where exposed by oxide 810. Then the exposed oxide 130 is removed. (In an alternative embodiment, the resist 820 is removed after the etch of polysilicon 140 and/or oxide 130.) The select gate lines are formed as a result. Each select gate 140 will control the conductivity of the underlying portion of the cell's channel region in substrate 120. FIG. 15 is a perspective view of the resulting structure in the array area.

The etch of polysilicon 140 can be a perfectly anisotropic vertical etch. Alternatively, the etch can have a horizontal component to reduce the width Ls (FIG. 14A) of select gate lines 140 (the width Ls is the channel length of the select gate transistor). In one embodiment, a perfectly vertical etch is performed first to remove the exposed portions of layer 140, and then an isotropic etch is performed to reduce the width Ls.

In another embodiment, one or more etching steps are performed as described above to form the lines 140. Then the sidewalls of lines 140 are oxidized. Substrate 120 is also oxidized in this step. The select gate line width Ls is reduced as a result. Then the oxide is removed.

The width Ls can also be reduced by a horizontal etch of layer 810. E.g., if layer 810 is SiON, a dry etch having a horizontal component can be used to pattern this layer.

In another embodiment, the sidewalls of the select gate lines are reacted with some material other than oxygen, with a reaction product forming on the sidewalls. The reaction product is then removed.

The lines 140 can thus be more narrow than the minimal photolithographic line width. The memory packing density is therefore increased.

As shown in FIG. 16 (cross section X1–X1'), the structure is oxidized to grow silicon dioxide 150 on substrate 120 and the sidewall surfaces of polysilicon gates 140 in the array area. Oxide 150 will serve as tunnel oxide on substrate 120, and will provide sidewall insulation for the select gates. The oxide thickness depends on the dopants and dopant concentrations. In some embodiments, oxide 150 is 60 Å to 100 Å thick on substrate 120, and is 300 Å thick on the select gate sidewalls. The peripheral area is covered by oxide 810 (FIG. 13B), and remains substantially unchanged during this step. Oxide 150 can be nitrided to prevent boron diffusion from floating gates 160 into substrate 120 if the floating gates will be doped with boron. In the embodiment being described, the floating gates will be doped P+ to improve the data retention time. (The data retention is improved because the P+ doped polysilicon is a high work function material. See U.S. Pat. No. 6,518,618 issued Feb. 11, 2003 to Fazio et al. and incorporated herein by reference.)

If desired, an additional Vt adjust implant can be performed into the array to adjust the threshold voltage of the floating gate transistors (FG/CG transistors). This implant can be performed either before or after the formation of oxide 150. In one embodiment, the implant is performed after the etch of polysilicon 140 to define the select gates (FIG. 14A) before the removal of oxide 130 from the FG/CG channel areas. The floating gate transistors can be either enhancement or depletion mode transistors.

Floating gate polysilicon 160 (FIG. 17, cross section X1–X1') is deposited over the structure, by LPCVD for example, and is doped P+ during or after the deposition. Polysilicon 160 is sufficiently thick to ensure that its top surface is at least as high throughout the wafer as the top surface of oxide 810. In the embodiment of FIG. 17, the top surface of layer 160 is planar due to a conformal deposition to a thickness larger than half the distance between the adjacent select gate lines 140. In one embodiment, the distance between select gate lines 140 is 0.8 μm, and the polysilicon 160 is more than 0.4 μm thick.

If the top surface of polysilicon 160 is not planar, it is planarized by CMP or a suitable etch.

After planarization (if needed), layer 160 is etched down without a mask. The etch end point is when STI oxide 220 becomes exposed. FIG. 18 (cross section X1–X1') shows an intermediate stage in this etch, when oxide 810 becomes exposed. At this stage, layer 160 has been removed from the periphery, so the periphery becomes as in FIG. 13B. The etch endpoint can be the exposure of oxide 220. The endpoint is well defined if the layer 810 is SiON or silicon nitride, but it is also possible to detect the exposure of oxide 220 if layer 810 is silicon dioxide. Alternatively, the etch can be programmed as a timed etch continuing for a predetermined time after the exposure of layer 810.

FIGS. 19A (cross section X1–X1') and 19B (cross section Y2–Y2') show the array area at the end of the polysilicon etch. The polysilicon has been removed from the top surface of oxide 220. In some embodiments, the final thickness of layer 160 is 1200 Å. The etch is selective to oxide 810.

Optionally, a timed etch of oxide 220 is performed to recess the top surface of oxide 220 below the surface of polysilicon 160. See FIG. 20A (cross section Y2–Y2') and FIG. 20B (perspective view of the array). This etch will improve the capacitive coupling between the floating and control gates. See the aforementioned U.S. Pat. No. 6,355,524. In the embodiment of FIGS. 20A, 20B, the oxide 220 continues to protrude above the top surface of substrate 120 by about 0.10 μm. In other embodiments, the oxide 220 does not protrude above the substrate after the etch (the top surface of layer 220 is level with the top surface of the substrate after the oxide etch).

As mentioned above, layer 810 is sufficiently thick to withstand this etch.

ONO layer 164 (FIG. 21A, cross section X1–X1', and FIG. 21B, periphery) is formed over the structure. Control gate polysilicon layer 170 is deposited on ONO 164 and is doped during or after the deposition. This layer is doped N+ in the embodiment being described, P+ in other embodiments. This may also be a metal or metal silicide layer, or some other conductive material.

The top surface of polysilicon 170 is not planar in the array area. Layer 170 has protrusions 170.1 over the select gate lines 140. Cavities 170C form in layer 170 between protrusions 170.1 over the future positions of bitline regions 174. The protrusions 170.1 will be used to define the overlap between the floating and control gates without additional dependence on photolithographic alignment.

As shown in FIG. 22 (cross section X1–X1'), a layer 1710 is deposited over the structure and etched without a mask to expose the polysilicon 170. Layer 1710 fills the cavities 170C. When layer 1710 is etched in the array area, layer 1710 is removed in the periphery, so the periphery becomes as in FIG. 211B. In one embodiment, layer 1710 is silicon nitride deposited to have a planar top surface or planarized during the etch.

Polysilicon 170 is etched without a mask. See FIG. 23A (cross section X1–X1') and 23B (periphery). This etch attacks the polysilicon portions 170.1 and exposes ONO 164. Polysilicon layer 170 becomes broken over the select gate lines 140. In other words, the polysilicon etch creates a gap 170G (a through hole) in polysilicon layer 170 over each select gate line 140. In the embodiment of FIG. 23A, the etch endpoint is the exposure of ONO 164. In other embodiments, the etch continues after the exposure of ONO 164. In either case, at the conclusion of the polysilicon etch, polysilicon 170 is exposed near the select gates 140 but some of polysilicon 170 is covered by nitride 1710. The width W1 of the exposed portions of polysilicon layer 170 adjacent to gaps 170G will define the width of the control and floating gates in a self-aligned manner as illustrated below.

In some embodiments, the minimum thickness of polysilicon 170 (near the gaps 170G) is 0.18 μm, and the width W1 is also 0.18 μm.

In the embodiment of FIG. 23A, the etch of polysilicon 170 is selective to nitride 1710. In other embodiments, the etch is not selective to the nitride, and nitride 1710 is etched at the same rate as the polysilicon. The etch can stop on the top oxide sub-layer of ONO 164. The etch can be replaced with CMP. In some embodiments, the etch or the CMP removes some or all of ONO 164 above the select gates 140 and exposes the oxide 810. In either case, at the conclusion of the etch or the CMP process, polysilicon 170 is exposed near the select gates 140 but some of polysilicon 170 is covered by nitride 1710. The width W1 of the exposed polysilicon portions will define the width of the control and floating gates as illustrated below.

A protective layer 1910 (FIG. 24, cross section X1–X1') is formed adjacent to gaps 170G to protect the polysilicon 170 near the select gates 140. In one embodiment, layer 1910 is silicon dioxide formed by thermal oxidation of layer 170. An exemplary thickness of oxide 1910 is 500 Å. Layer 1910 can also be a conductive metal silicide formed selectively on polysilicon 170 by a salicide (self-aligned silicidation) technique. In another embodiment, layer 1910 is deposited over the whole wafer and then removed by CMP from the top surface of layer 1710. See U.S. patent application Ser. No. 10/393,212 filed Mar. 19, 2003 by Yi Ding and incorporated herein by reference.

Nitride 1710 is removed (by a wet etch for example) selectively to oxide 1910. The resulting structure is shown in FIG. 25 (cross section X1–X1'). The periphery remains as in FIG. 23B.

Polysilicon 170, ONO 164, and polysilicon 160 are etched with oxide 1910 as a mask. The resulting structure is shown in FIG. 26A (cross section X1–X1') and FIG. 26B (periphery). In some embodiments, the polysilicon etch of layers 170, 160 is anisotropic, and the etch of ONO 164 is isotropic or anisotropic. The ONO etch may remove the ONO 164 over the select gates 140 and may also remove portions of oxide 1910 and/or oxide 810.

In each FG/CG stack, the floating gate 160 together with control gate 170 control the underlying portion of the cell's channel region.

A photoresist layer (not shown) is formed over the wafer and patterned to cover the array but expose the entire periphery. Then oxide 810 (FIG. 26B) is etched away from the peripheral area.

The resist covering the array is removed, and another photoresist layer (not shown) is formed to cover the array and define the peripheral transistor gates. Polysilicon 140 is etched away where exposed by this resist.

The resist is removed. The wafer is coated with a photoresist layer 2720 (FIG. 27B, periphery). The resist is patterned to expose the entire array area (FIG. 27A, cross section X1–X1') and also to expose the peripheral NMOS transistor regions. FIG. 27B shows a peripheral NMOS transistor region 512N with a P well 2724P, and a peripheral PMOS transistor region 512P with an N well 2724N. These wells were defined before formation of oxide 130. There can be many regions 512N, 512P in the integrated circuit. Resist 2720 covers the PMOS transistor regions 512P. An N type implant (N−) is performed to form the LDD (lightly doped drain) extensions for peripheral NMOS source/drain regions 2730N (FIG. 27B). This implant also dopes the NMOS gates 140 in the periphery. In addition, the implant dopes bitline regions 174 (FIG. 27A).

In some embodiments, the memory array is not exposed by resist 2720, and no doping is performed in the bitline regions at this step.

Resist 2720 is removed, and another photoresist layer 2820 (FIG. 28, periphery) is formed to cover the NMOS peripheral transistor regions 512N and the memory array. A P type implant (P−) is performed to form the LDD extensions for PMOS source/drain regions 2730P and to dope the peripheral PMOS transistor gates.

Resist 2820 is removed. A thin silicon dioxide layer 2904 (see FIG. 29A, cross section X1–X1', and FIG. 29B, periphery) is grown on the exposed silicon surfaces of layers 140, 160, 170 by a rapid thermal oxidation process (RTO). Alternative techniques can also be used such as chemical vapor deposition (e.g. TEOS CVD), a high temperature oxide process (HTO), or other suitable techniques, known or to be invented. These techniques may form the oxide 2904 over the entire structure and not only on the silicon surfaces. An exemplary thickness of oxide 2904 is 100 Å.

A silicon nitride layer 2910 is deposited to an exemplary thickness of 500 Å to 800 Å. Layer 2910 is etched anisotropically without a mask to form sidewall spacers over the gate structures. The etch of nitride 2910 may remove some of oxide 810 in the array area (FIG. 29A). If oxide 2904 was deposited over the entire structure (by TEOS CVD or HTO for example), oxide 2904 will help protect the substrate 120 during the nitride etch.

Then N+ and P+ implants are performed to create source/drain structures for the peripheral transistors and the bitline regions 174. More particularly, the peripheral PMOS transistor area 512P is masked with resist (not shown), and an N+ implant is performed to create the source/drain structures for bitline regions 174 and the peripheral NMOS transistors and increase the dopant concentration in the peripheral NMOS gates 140. The floating, control and select gates and the overlying layers mask this implant so no additional masking in the array area is needed.

The resist is removed. The array and the peripheral NMOS transistor regions 512N are masked with a resist (not shown), and a P+ implant is performed to create the source/drain structures for the peripheral PMOS transistors and increase the dopant concentration in the PMOS transistor gates 140.

The resist is removed. A silicon dioxide etch is performed to remove the oxide 1910 and expose the control gate lines 170 (FIG. 30A, cross section X1–X1'). This etch also removes the exposed portions of oxide 150 over bitline regions 174 in the array area, the exposed oxide 130 over source/drain regions 2730N, 2730P in the periphery (see FIG. 30B), and the oxide 2904 over the peripheral transistor gates.

A conductive metal silicide layer 2920 is formed by a self-aligned silicidation (salicide) process on the exposed silicon surfaces of control gate lines 170, bitline regions 174, peripheral transistor gates 140 and peripheral source/drain regions 2730N, 2730P. The salicide process involves depositing a metal layer, heating the structure to react the metal with the silicon, and removing the unreacted metal. This can be followed by an anneal or any other suitable processing, known or to be invented, to improve the silicide properties (e.g. increase its conductivity). Titanium, cobalt, nickel, and other conductive materials, known or to be invented, can be used for the metal layer. Non-salicide selective deposition techniques, known or to be invented, that selectively form a conductive layer 2920 on the exposed silicon but not on a non-silicon surface, can also be used. Silicide 2920 has a lower resistivity and a lower sheet resistance than polysilicon 170.

As noted above in connection with FIG. 24, layer 1910 can be a conductive metal silicide formed by a salicide process. In this case, layer 1910 does not have to be removed. The silicidation process of FIG. 30A will silicide the bitline regions 174, the peripheral gates 140 and the peripheral source/drain regions 2730.

As shown in FIG. 31A (cross section X1–X1'), FIG. 31B (array boundary or an array gap without floating gates), and FIGS. 31C and 31D (periphery), inter-level dielectric 3204 is deposited over the wafer. FIG. 31C shows only an NMOS transistor region, but the PMOS regions are similar. Contact openings are etched in dielectric 3204 to expose the silicided surfaces of bitline regions 174 (FIG. 31A), control gates 170 (FIG. 31B), peripheral source/drain regions 2730N and 2730P (FIGS. 30B, 31C), and peripheral gates 140 (FIG. 31D). The silicide 2920 protects the bitline regions 174 and the source/drain regions 2730 during this etch. A conductive layer 3210 (e.g. metal) is deposited and patterned to contact the silicided regions. The figures also show an optional metal layer 3220 (e.g. tungsten) used to fill the contact openings before the deposition of layer 3210.

Figure 9:
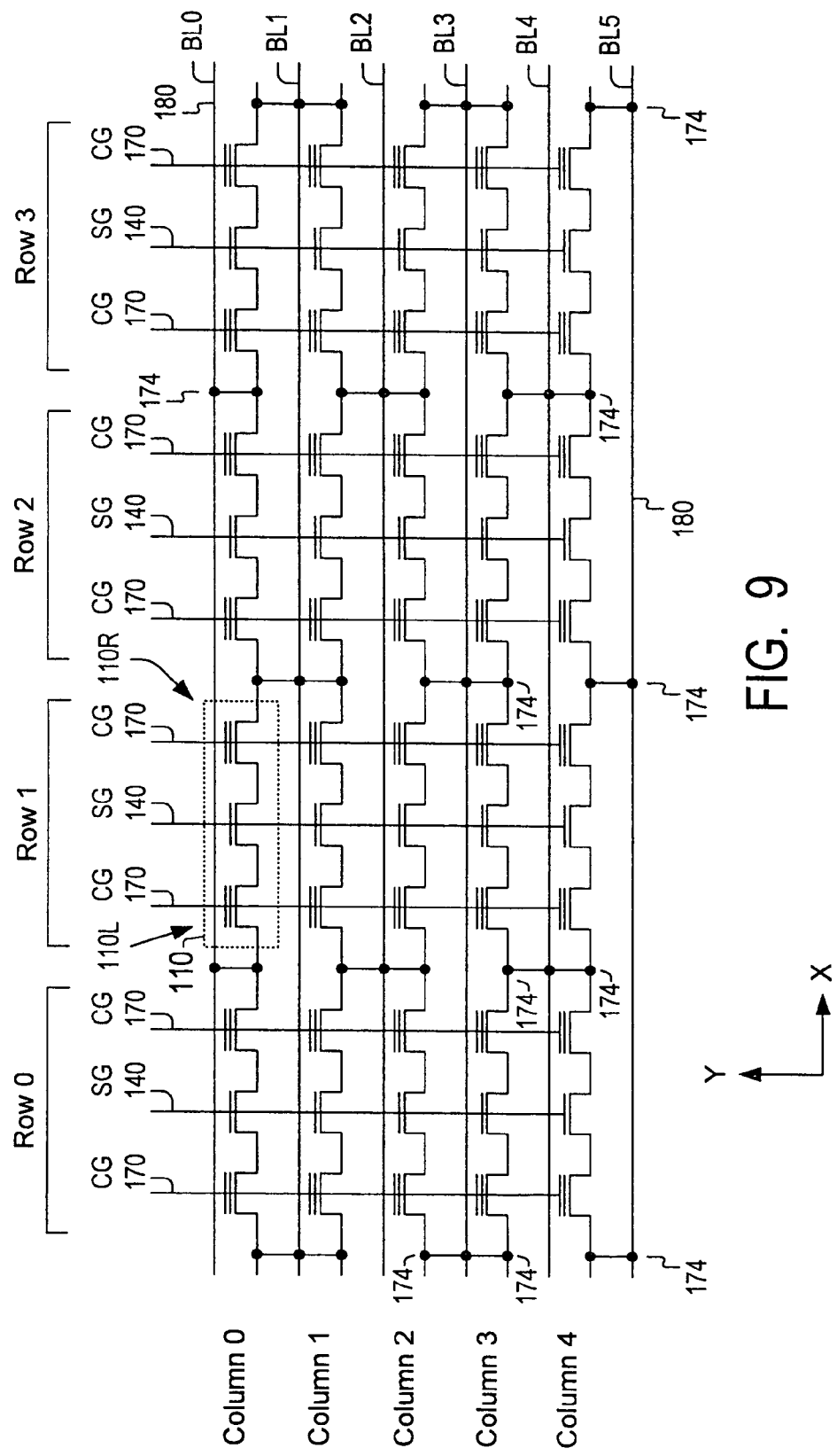
FIG. 9 is a circuit diagram of a memory array according to an embodiment of the present invention.
Figure 10A:
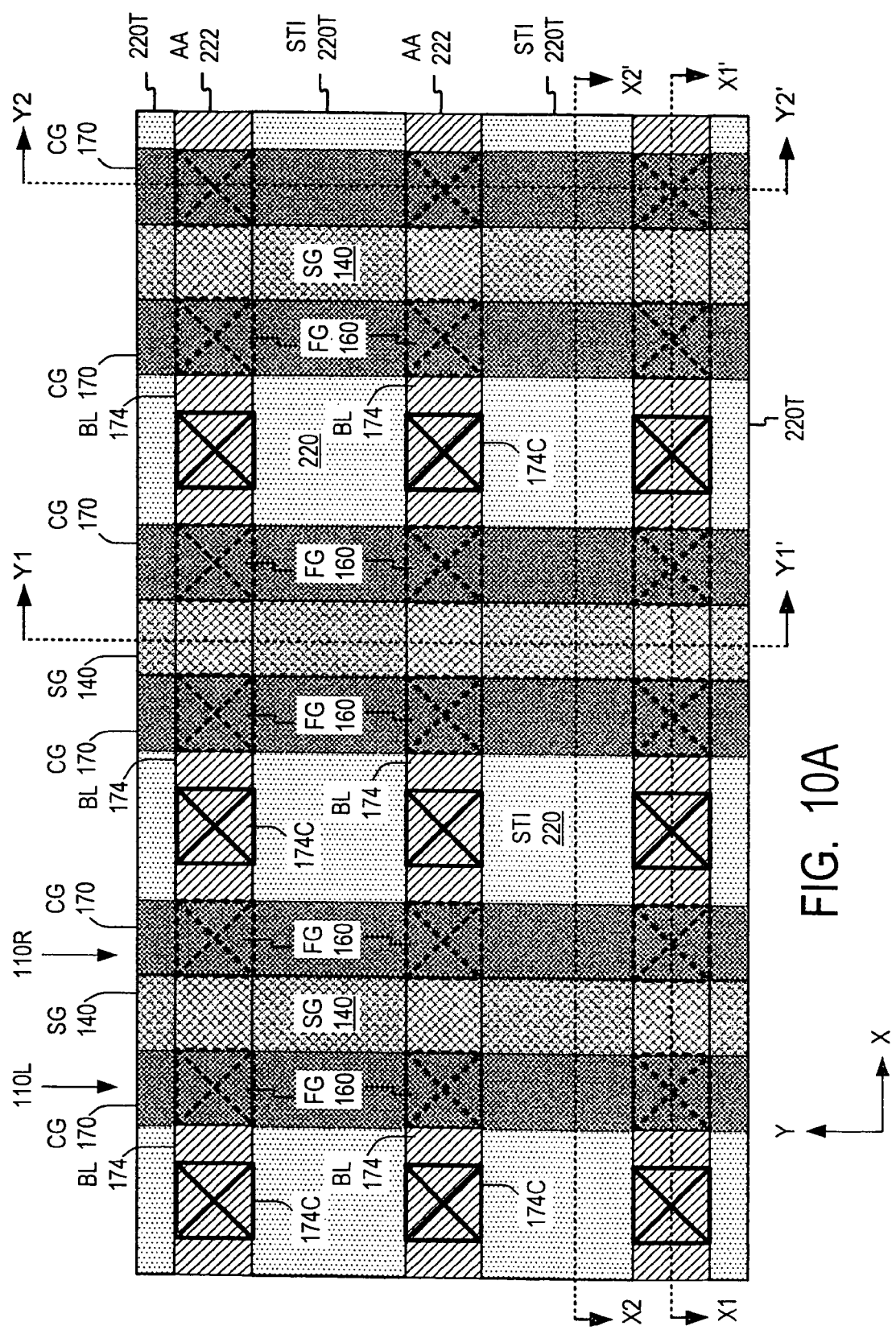
FIG. 10A is a top view of a memory array according to an embodiment of the present invention.
Figure 10B:
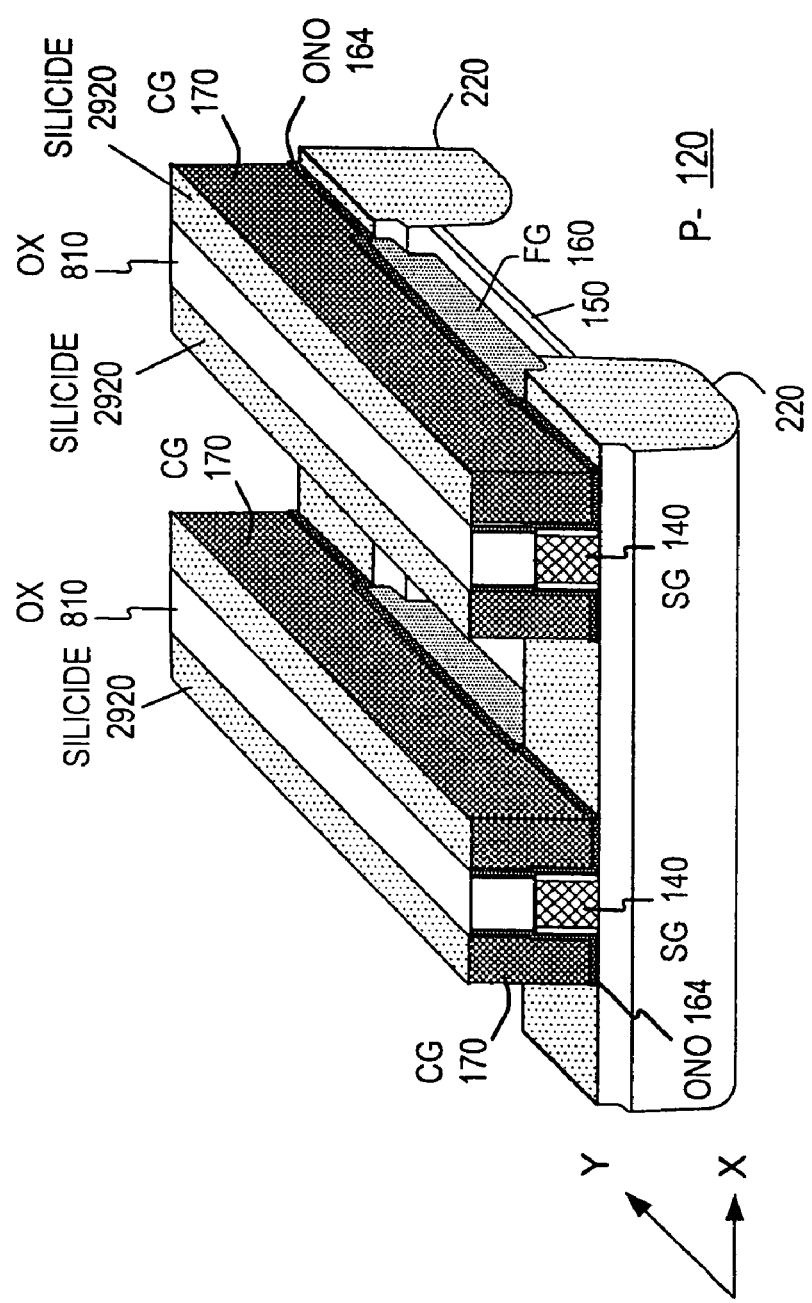
FIG. 10B is a perspective view showing some features of the memory of FIG. 10A.

In the embodiment of FIG. 31A, metal 3210 is used to form jumpers between the adjacent bitline regions 174 connected together (see FIG. 9). Then another dielectric layer 3230 (not shown in FIGS. 31B–31D) is deposited, contact openings are etched in this layer to jumpers 3210, and another metal layer 3240 is deposited on top and patterned to form the bitlines 180. The bitlines contact the bitline regions 174 through the jumpers made from metal 3210. The openings in layer 3240 are filled with optional tungsten plugs 3250 before the metal 3240 is deposited.

FIG. 31F (top view) shows an extension of a peripheral transistor gate 140 over STI oxide 220. The extension can be made to form a contact to the gate or for some other reason (e.g. to connect the gate to other features). The region 120$i$ at the interface between the substrate 120 and field oxide 220 is protected from the divot formation because the gate is formed using the first polysilicon layer 140. See also FIG. 13B. The transistor of FIG. 31E can be a high voltage transistor (in area 512H in FIG. 12B) or a low voltage transistor (in area 512L).

In FIG. 30A, the width of select gate 140 is shown as Ls, and the width of each of floating gates 160 is shown as Lf. The floating gate width Lf is defined by the parameter W1 (FIG. 23A) in a self-aligned manner, so Lf can be smaller than the minimal photolithographic line width. Ls can also be smaller than the minimal photolithographic line width as explained above in connection with FIG. 14A. Ls can be smaller than Lf, or can be equal to or larger than Lf.

In each bit of the memory cell, ONO layer 164 forms a continuous feature overlying the respective floating gate and overlaying a sidewall of select gate line 140. This feature extends the whole length of the select gate line 140 (in the Y direction). Control gate 170 overlies the continuous feature of ONO 164. The portion of ONO 164 overlaying the sidewall of select gate line 140 separates the control gate 170 from the select gate 140.

Other details of the memory fabrication process for one embodiment are given in U.S. patent application Ser. No. 10/393,212 "NONVOLATILE MEMORIES AND METHODS OF FABRICATION" filed Mar. 19, 2003 by Yi Ding and incorporated herein by reference.

Figure 32:
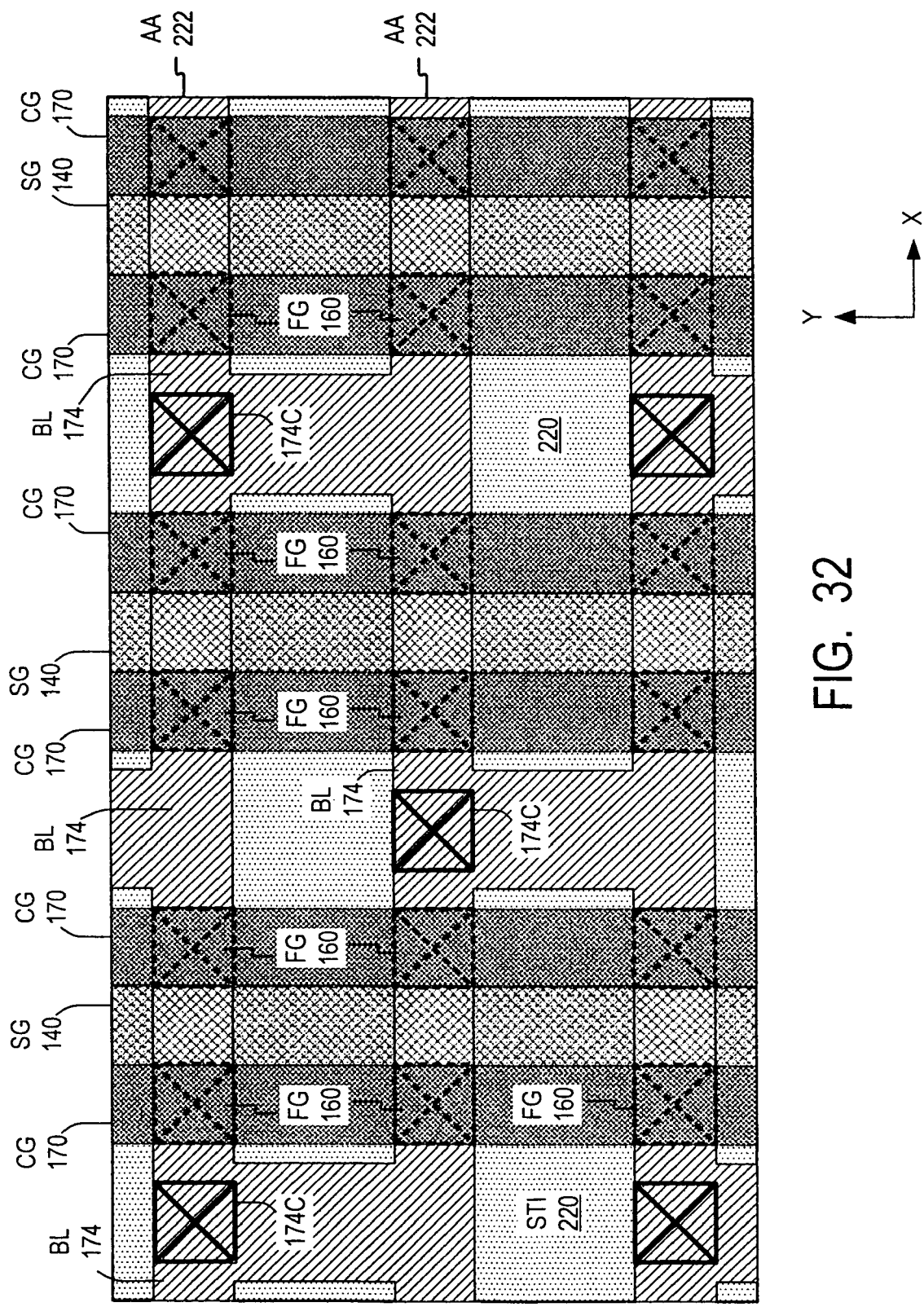

FIG. 32 shows an alternative layout of the array. Here the connection between the source/drain regions 174 in the adjacent columns is done through the substrate 120. Each contiguous N+ type region 174 provides two source/drain regions for one of the two adjacent columns and also provides two source/drain regions 174 for the other one of the adjacent columns. In the first and last rows of the array, each region 174 provides one source/drain region for each of the two adjacent columns. Jumpers made from layer 3210 of FIG. 31A are unnecessary. Layer 3210 can be used to form the bitlines 180. The number of bitline contact openings 174C can be reduced, because only one contact is needed for each pair of source/drain regions 174 that are shorted together. Other layouts are also possible.

Figure 7:
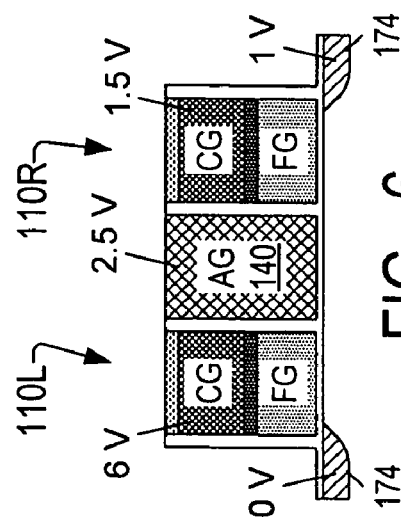
Figure 8:
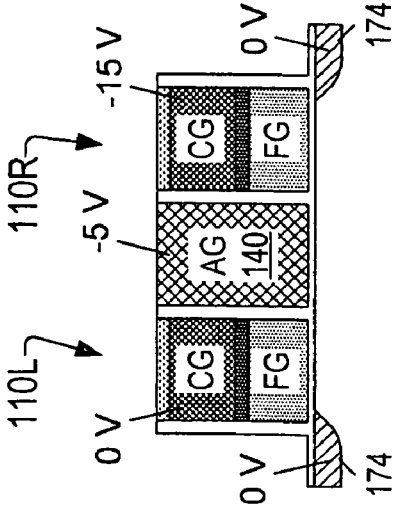

In some embodiments, the memory cells are read, programmed and erased using the same voltages and mechanisms as the cell of FIG. 5. The programming is done by channel hot electro ejection (CHIE) or Fowler-Nordheim tunneling. The voltages can be as in FIGS. 6–8. Other exemplary voltages are shown in the following Table 1:

TABLE 1

|  | Read | Program (CHEI) | Erase |
| --- | --- | --- | --- |
| Select gate 140 |  |  |  |
| Selected row: | 2.5 V | 1.5 V | 2 V |
| Unselected row: | 0 V | 0 V | 0 V |
| Control gate 170 |  |  |  |
| Selected row: |  |  |  |
| Selected bit (Left or Right): | 1.5 V to 2 V | 9 V to 10 V | −9 V to −10 V |
| Unselected bit: | 7 V to 7.5 V | 7 V to 7.5 V | 0 V |
| Unselected row: | 0 V | 0 V | 0 V |
| Bitline 180 |  |  |  |
| Selected column: |  |  |  |
| Selected bit: | 1.5 V | 4.5 V to 5 V | Floating |
| Unselected bit: | 0 V | 0 V | 0 V |
| Unselected column: | 0 V | 0 V | 0 V |
| Substrate 120: | 0 V | 0 V | 7 V to 8 V |

The erase operation is through the channel region in substrate 120 (bulk erase). In other embodiments, the memory is erased through a source/drain region 174. The programming can be performed by Fowler-Nordheim tunneling. In some embodiments, the programming is performed by an electron transfer between floating gate 160 and select gate 140.

The invention is not limited to any particular read, erase or programming techniques, or to particular voltages. For example, the memory can be powered by multiple power supply voltages. Floating gates 160 can be defined using a masked etch, and can extend over sidewalls of select gate lines 140. See U.S. patent application Ser. No. 10/411,813 filed by Yi Ding on Apr. 10, 2003 and incorporated herein by reference. Select gates 140 and/or floating gates 160 may be doped N+, and/or may include non-semiconductor materials (e.g. metal silicide). The invention is not limited to the arrays of FIG. 9. Also, substrate isolation regions 220 do not have to traverse the entire array. The invention is applicable to non-flash memories (e.g. non-flash EEPROMs) and to multi-level memory cells (such a cell can store multiple bits of information in each floating gate). Other embodiments and variations are within the scope of the invention, as defined by the appended claims.

The invention claimed is:

1. A method for fabricating a nonvolatile memory, the method comprising:
   (1) forming a first conductive gate for a nonvolatile memory cell;
   (2) after the operation (1), forming conductive floating gates FG1 and FG2 for the memory cell;
   wherein the nonvolatile memory cell is part of an array of nonvolatile memory cells, each memory cell of the array having conductive floating gates FG1 and FG2 and a first conductive gate;
   wherein the method comprises, before the operation (1), performing the following operation:
   (a) forming one or more substrate isolation regions in a semiconductor substrate between active areas of the semiconductor substrate, each substrate isolation region being a dielectric region protruding above the semiconductor substrate;
   wherein the operation (1) comprises:
   (b) forming one or more conductive lines G1, each conductive line G1 overlying at least one active area, wherein each first conductive gate comprises a portion of a line G1;
   wherein the operation (2) comprises:
   (c) forming a layer ("FG layer") over the first conductive lines and the substrate isolation regions, wherein each of the floating gates FG1, FG2 of each memory cell comprises a portion of the FG layer;
   (d) partially removing the FG layer to expose the substrate isolation regions and to remove the FG layer from over at least a portion of each conductive line G1.

2. The method of claim 1 wherein the operation (d) is terminated with reference to a time of detecting that the substrate isolation regions have been exposed.

3. The method of claim 2 wherein each substrate isolation region traverses the memory array, and each conductive line G1 crosses over plural substrate isolation regions.

4. The method of claim 1 wherein the top surface of each line G1 is planar but the bottom surface of each line G1 goes up and down over the substrate isolation regions.

5. The method of claim 1 further comprising, before forming the FG layer, forming a dielectric over sidewalls of each conductive line G1 to insulate the conductive lines G1 from the floating gates.

6. The method of claim 5 wherein each memory cell further comprises two second conductive gates insulated from the first conductive gate and the floating gates FG1 and FG2, and the method further comprises:
   (e) after the operation (d), forming a dielectric D1 over the FG layer;
   (f) forming a layer G2 over the dielectric D1, wherein each second conductive gate comprises a portion of the layer G2;
   (g) partially removing the layer G2 and the FG layer to form the floating gates and to form from the layer G2 one or more conductive lines for the second conductive gates, wherein each second conductive gate comprises a portion of a conductive line formed from the layer G2.

7. The method of claim 6 wherein in the operation (f), the layer G2 is formed to have a portion P1 protruding above each conductive line G1; and the operation (g) comprises:
(g1) forming a layer L1 over the layer G2 such that the protruding portions P1 of the layer G2 are exposed and not completely covered by the layer L1;
(g2) at least partially removing the protruding portions P1 of the layer G2 to form a gap in the layer G2 over each line G1, wherein at a conclusion of this removing operation a portion of the layer G2 remains covered by the layer L1;
(g3) forming a layer L2 on the layer G2 adjacent to the gaps; and
(g4) removing at least parts of the layers L1 and G2 selectively to the layer L2.

8. The method of claim 7 wherein the operation (g1) comprises:
forming the layer L1 over the entire layer G2; and
planarizing the layer L1 to expose the protruding portions P1.

9. The method of claim 7 wherein the operation (g3) comprises reacting the layer G2 with another material to form the layer L2.

10. The method of claim 9 wherein the reacting operation comprises oxidation of the layer G2.

11. The method of claim 9 wherein the reacting operation comprises a chemical reaction of the layer G2 with a metal, and the chemical reaction is followed by removal of non-reacted metal.

12. The method of claim 7 further comprising, after the operation (g4):
removing the layer L2 to expose an underlying surface of the layer G2; and
reacting the exposed surface of the layer G2 with a conductive material to form a conductive layer on the surface of the layer G2.

13. The method of claim 12 wherein the conductive layer has a lower resistivity than the layer G2.

14. The method of claim 12 further comprising, before the reacting operation, forming dielectric on at least portions of sidewalls of the layer G2, wherein the conductive layer is formed selectively on the exposed surface of the layer G2 but not on the dielectric.

15. The method of claim 12 wherein the reacting operation comprises a reaction with a metal.

16. The method of claim 12 wherein:
the first conductive gate is part of a first conductive line that provides first conductive gates to a plurality of nonvolatile memory cells;
each of the second conductive gates is part of a second conductive line that provides second conductive gates to said plurality of the memory cells;
the portion P1 and the conductive layer extend along the first conductive line through said plurality of the memory cells, the conductive layer reducing the sheet resistance of the second conductive lines.

17. The method of claim 12 wherein the memory cell comprises a source/drain region in the semiconductor substrate, and the conductive layer forms on the source/drain region.

18. A method for fabricating an integrated circuit which comprises a nonvolatile memory which comprises an array of nonvolatile memory cells, the integrated circuit comprising an array area containing the array, each memory cell of the array having a first conductive gate and having at least two conductive floating gates FG1 and FG2, the method comprising:
(i) forming one or more conductive lines G1, wherein each first conductive gate comprises a portion of a line G1;
(ii) forming a layer G2 over the first conductive lines, each memory cell having at least two second conductive gates comprising a portion of the layer G2, the layer G2 having a portion P1 protruding above each conductive line G1;
(iii) forming a layer L1 over the layer G2 such that the protruding portions P1 of the layer G2 are exposed and not completely covered by the layer L1;
(iv) partially removing the protruding portions P1 of the layer G2 to form a gap in the layer G2 over each line G1, wherein at a conclusion of this removing operation a portion of the layer G2 remains covered by the layer L1;
(v) forming a layer L2 on the layer G2 adjacent to the gaps; and
(vi) removing at least parts of the layer L1 and the layer G2 selectively to the layer L2.

19. The method of claim 18 wherein each second conductive gate is a control gate.

20. The method of claim 18 wherein the operation (iii) comprises:
forming the layer L1 over the entire layer G2; and
planarizing the layer L1 to expose the protruding portions P1.

21. The method of claim 18 wherein the operation (v) comprises reacting the layer G2 with another material to form the layer L2.

22. The method of claim 21 wherein the reacting operation comprises oxidation of the layer G2.

23. The method of claim 21 wherein the reacting operation comprises a chemical reaction of the layer G2 with a metal, and the chemical reaction is followed by removal of non-reacted metal.

24. The method of claim 18 further comprising, after the operation (vi):
removing the layer L2 to expose an underlying surface of the layer G2; and
reacting the exposed surface of the layer G2 with a conductive material to form a conductive layer on the surface of the layer G2.

25. The method of claim 24 wherein the conductive layer has a lower resistivity than the layer G2.

26. The method of claim 24 further comprising, before the reacting operation, forming dielectric on at least portions of sidewalls of the layer G2, wherein the conductive layer is formed selectively on the exposed surface of the layer G2 but not on the dielectric.

27. The method of claim 24 wherein the reacting operation comprises a reaction with a metal.

28. The method of claim 24 wherein:
each of the second conductive gates is part of a second conductive line that provides second conductive gates to said plurality of the memory cells;
the portion P1 and the conductive layer extend along the conductive line G1 through said plurality of the memory cells, the conductive layer reducing the sheet resistance of the second conductive lines.

29. The method of claim 24 wherein the memory cell comprises a source/drain region in the semiconductor substrate, and the conductive layer forms on the source/drain region.

* * * * *

UNITED STATES PATENT AND TRADEMARK OFFICE
CERTIFICATE OF CORRECTION

PATENT NO. : 7,018,895 B2  Page 1 of 1
APPLICATION NO. : 11/102066
DATED : March 28, 2006
INVENTOR(S) : Yi Ding It is certified that error appears in the above-identified patent and that said Letters Patent is hereby corrected as shown below:

Col. 3, line 28, Delete "is" and insert --as--
Col. 8, line 2, Delete "211B" and insert --21B--

Signed and Sealed this

Twenty-fifth Day of December, 2007

JON W. DUDAS
*Director of the United States Patent and Trademark Office*